(12) United States Patent
Maruyama et al.

(10) Patent No.: US 7,282,380 B2
(45) Date of Patent: Oct. 16, 2007

(54) METHOD FOR MANUFACTURING SEMICONDUCTOR DEVICE

(75) Inventors: Junya Maruyama, Ebina (JP); Atsuo Isobe, Atsugi (JP); Susumu Okazaki, Atsugi (JP); Koichiro Tanaka, Atsugi (JP); Yoshiaki Yamamoto, Atsugi (JP); Koji Dairiki, Atsugi (JP); Tomoko Tamura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 138 days.

(21) Appl. No.: 11/079,262

(22) Filed: Mar. 15, 2005

(65) Prior Publication Data

US 2005/0214984 A1   Sep. 29, 2005

(30) Foreign Application Priority Data

Mar. 25, 2004  (JP)  .............................. 2004-088613

(51) Int. Cl.
*H01L 21/00* (2006.01)
*H01L 21/76* (2006.01)
(52) U.S. Cl. .................. 438/30; 438/166; 438/406; 257/E21.01
(58) Field of Classification Search ................ 438/166, 438/30, 406
See application file for complete search history.

(56) References Cited

U.S. PATENT DOCUMENTS

| 5,258,325 | A | 11/1993 | Spitzer et al. |
| 5,821,138 | A * | 10/1998 | Yamazaki et al. .......... 438/166 |
| 5,834,327 | A | 11/1998 | Yamazaki et al. |
| 6,946,361 | B2 | 9/2005 | Takayama et al. |
| 6,998,282 | B1 * | 2/2006 | Yamazaki et al. ............ 438/30 |
| 7,060,153 | B2 | 6/2006 | Yamazaki et al. |
| 7,122,445 | B2 | 10/2006 | Takayama et al. |
| 2003/0022403 | A1 | 1/2003 | Shimoda et al. |
| 2003/0032210 | A1 | 2/2003 | Takayama et al. |
| 2004/0129960 | A1 | 7/2004 | Maruyama et al. |
| 2004/0232459 | A1 | 11/2004 | Takayama et al. |

(Continued)

FOREIGN PATENT DOCUMENTS

JP        08-262474        10/1996

(Continued)

*Primary Examiner*—Scott B. Geyer
*Assistant Examiner*—Elias Ullah
(74) *Attorney, Agent, or Firm*—Eric J. Robinson; Robinson Intellectual Property Law Office, P.C.

(57) ABSTRACT

It is an object of the present invention to provide a method for manufacturing a semiconductor device, capable of keeping a peeling layer from being peeled from a substrate in the phase before the completion of a semiconductor element and peeling a semiconductor element rapidly. It is considered that a peeling layer tends to be peeled from a substrate because the stress is applied to a peeling layer due to the difference in thermal expansion coefficient between a substrate and a peeling layer, or because the volume of a peeling layer is reduced and thus the stress is applied thereto by crystallization of the peeling layer due to heat treatment. Therefore, according to one feature of the invention, the adhesion of a substrate and a peeling layer is enhanced by forming an insulating film (buffer film) for relieving the stress on the peeling layer between the substrate and the peeling layer before forming the peeling layer over the substrate.

31 Claims, 18 Drawing Sheets

U.S. PATENT DOCUMENTS

2004/0263712 A1* 12/2004 Yamazaki et al. ............ 349/45
2005/0148121 A1   7/2005 Yamazaki et al.
2005/0282357 A1  12/2005 Takayama et al.
2006/0207714 A1   9/2006 Yamazaki et al.

FOREIGN PATENT DOCUMENTS

| JP | 08-262475 | 10/1996 |
| JP | 08-264796 | 10/1996 |
| JP | 2003-203898 | 7/2003 |
| WO | WO 2005/057658 | 6/2005 |

* cited by examiner 116　105　106　107　115

METHOD FOR MANUFACTURING SEMICONDUCTOR DEVICE

BACKGROUND OF THE INVENTION

1. Field of the Invention

The present invention relates to a method for manufacturing a semiconductor device in which a semiconductor element formed on an insulating surface is peeled.

2. Description of the Related Art

A flexible substrate such as a plastic substrate is superior to a glass substrate in terms of mechanical strength against vibration and impact, and the thickness is easily reduced. In addition, the shape of the flexible substrate has higher possibility compared with a glass substrate. Therefore, various applications of a semiconductor device using the flexible substrate are expected. However, a flexible substrate such as a plastic substrate may often not have such a high heat resistance that it can withstand heat treatment during a step of manufacturing a semiconductor element. Accordingly, a manufacturing method in which a semiconductor element formed over a heat-resistant substrate is peeled and attached to a flexible substrate separately provided has been conventionally employed.

Reference 1 (Japanese Patent Laid-Open No. 8-262475) discloses a technique to form a peeling layer using silicon over a substrate, form an integrated circuit using a thin film transistor over the peeling layer, remove the peeling layer by etching to peel the substrate from the integrated circuit, and then, attach the integrated circuit to another substrate.

However, in the step of manufacturing a semiconductor element, there is a problem that the peeling layer tends to be peeled from the substrate when heat treatment of the peeling layer is performed in the process of manufacturing the semiconductor element. After completing the semiconductor element, the peeling layer is peeled from the substrate in the end; however, it is difficult to continue manufacturing the semiconductor element when the peeling layer is peeled from the substrate before the semiconductor element is completed. Therefore, it is necessary to keep the peeling layer from being peeled from the substrate at least in the phase before the completion of the semiconductor element.

In addition, in manufacturing the semiconductor device which is formed by peeling the semiconductor element, the time spent on the peeling step depends on the speed of etching a peeling layer (etching rate). Thus, the higher the etching rate is, the more rapidly the semiconductor element can be peeled. Accordingly, TAT (Turn Around Time) can be preferably shortened.

SUMMARY OF THE INVENTION

It is an object of the present invention to provide a method for manufacturing a semiconductor device, capable of keeping a peeling layer from being peeled from a substrate in the phase before the completion of a semiconductor element and peeling a semiconductor element rapidly.

It is considered by the inventors that a peeling layer tends to be peeled from a substrate because the stress is applied to a peeling layer due to the difference in thermal expansion coefficient between a substrate and a peeling layer, or because the volume of a peeling layer is reduced and thus the stress is applied thereto by crystallization of the peeling layer due to heat treatment. Therefore, according to one feature of the invention, the adhesion of a substrate and a peeling layer is enhanced by forming an insulating film (buffer film) for relieving the stress on the peeling layer between the substrate and the peeling layer before forming the peeling layer over the substrate.

In a step of peeling a semiconductor element (peeling step), an insulating film (base film) to protect a semiconductor element is formed over a peeling layer and a semiconductor film used for a semiconductor element is formed over the base film. Then, according to the invention, a continuous-wave laser is used for crystallizing the semiconductor film.

In the case of a continuous-wave laser, which is different from a pulsed laser, a semiconductor film is irradiated with laser light while scanning the semiconductor film in one direction and a crystal is continuously grown in a scanning direction; therefore, the mass of the crystal grain extended in the scanning direction can be formed. A thin film transistor (TFT) having high characteristics almost without a crystal grain boundary in the direction intersecting with the moving direction of carriers can be formed by using the mass of the crystal grain extended in the scanning direction for an active layer of a TFT.

Instead of a continuous-wave laser, laser crystallization may be performed by using pulsed laser light with repetition rates of 10 MHz or more, which is in a repetition rate band extremely higher than a repetition rate band of several tens Hz to several hundreds Hz that is usually used. It is said that the time between irradiation of a semiconductor film with pulsed laser light and complete solidification thereof is several tens nsec to several hundreds nsec. Accordingly, the semiconductor film can be irradiated with the next pulsed laser light after the semiconductor film is dissolved before solidified by using the above repetition rate band. Therefore, since solid-fluid interface can be moved continuously in the semiconductor film, a semiconductor film having a crystal grain continuously grown in a scanning direction is formed. It is possible to form a semiconductor film almost without a crystal grain boundary at least in the channel direction of a TFT by forming a single crystal grain extended in the scanning direction.

Furthermore, according to the invention, a peeling layer may also be crystallized when laser crystallization of a semiconductor film is performed. An etching rate of the peeling layer can be enhanced by performing crystallization of the peeling layer; thus, a semiconductor element can be peeled rapidly. When heat is applied to a peeling layer or a peeling layer is crystallized by laser crystallization, the stress is applied to the peeling layer. However, since a buffer film is formed between a substrate and the peeling layer according to the invention, the peeling layer can be kept from being peeled from the substrate in the phase before the completion of the semiconductor element.

Note that a semiconductor device employing the manufacturing method of the invention includes the following in its category: various semiconductor devices including an integrated circuit such as a microprocessor or an image processing circuit, a semiconductor display device, and the like. The semiconductor display device includes the following in its category: a liquid crystal display device, a light-emitting device provided with a light-emitting element typified by an organic light-emitting diode (OLED) in each pixel, a DMD (Digital Micromirror Device), a PDP (Plasma Display Panel), an FED (Field Emission Display), and other display devices having a circuit element using a semiconductor film for a driver circuit.

An ID chip is particularly given as one of the semiconductor devices which can be formed by employing the manufacturing method of the invention. The ID chip is a semiconductor device capable of sending and/or receiving data such as identification information by radio, which is being put to practical use in various fields. The ID chip is also referred to as a radio tag, a RFID (Radio Frequency Identification) tag, and an IC tag.

An ID chip employing the manufacturing method of the invention has an integrated circuit using a thin semiconductor film. A mode having an antenna in addition to the integrated circuit is applicable to the ID chip employing the manufacturing method of the invention. The integrated circuit can be operated using alternating voltage generated by the antenna and can send a signal to a reader/writer by modulating the alternating voltage to be applied to the antenna. Note that the antenna may be formed concurrently with the integrated circuit, or, it may be formed separately from the integrated circuit and then electrically connected thereto.

According to the invention having the above structure, a peeling layer can be kept from being peeled from a substrate in the phase before the completion of a semiconductor element and a semiconductor element can be peeled rapidly.

These and other objects, features and advantages of the invention will become more apparent upon reading of the following detailed description along with the accompanied drawings.

DETAILED DESCRIPTION OF THE INVENTION

Embodiment Mode of the present invention will be described below with reference to the accompanying drawings. However, it is easily understood by those skilled in the art that various modes will be applicable to the invention and various changes and modifications will be apparent unless such changes and modifications depart from purpose and the scope of the invention. Therefore, the invention is not interpreted with limiting to the description in this embodiment mode.

Figure 1A:
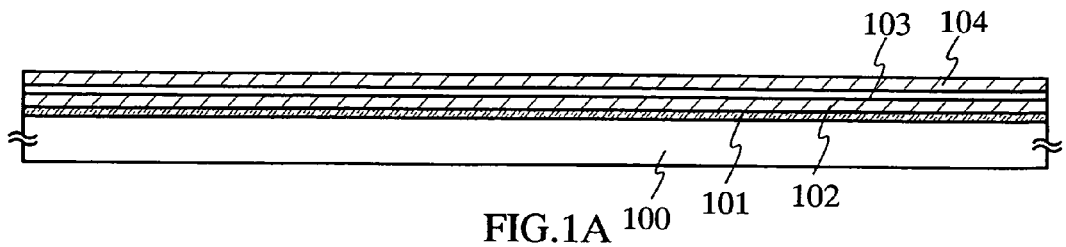
FIGS. 1A to 1D are cross-sectional views showing a method for manufacturing a semiconductor device according to certain aspects of the present invention.

A method for manufacturing a semiconductor device of the invention is described with reference to FIGS. 1A to 1D and FIGS. 2A and 2B. First, as shown in FIG. 1A, a buffer film 101 for relieving the stress on a peeling layer 102 to be subsequently formed is formed on a heat-resistant substrate (first substrate) 100. Any insulating film can be used for the buffer film 101 as long as it can relieve the stress on the peeling layer 102 and can enhance adhesion between the first substrate 100 and the peeling layer 102, for example, the buffer film 101 can be formed from silicon oxide or silicon oxynitride.

Note that silicon oxynitride in this specification means the material of an insulating film denoted by SiOxNy (x>y), which is distinguished from silicon nitride oxide denoted by SiNxOy (x>y).

Next, the peeling layer 102 is formed on the buffer film 101. It is desirable to form the peeling layer 102 from a material that can be crystallized when laser crystallization of a semiconductor film 104 is subsequently performed and that can be removed by etching. Silicon can be used specifically, for example.

A base film 103 is formed over the peeling layer 102. The base film 103 is provided to prevent alkali metal such as Na or alkaline earth metal from diffusing into the semiconductor film 104 to be subsequently formed and causing an adverse effect on characteristics of a semiconductor element such as a TFT. In addition, the base film 103 also serves to protect a semiconductor element in a subsequent step of peeling the semiconductor element.

The semiconductor film 104 is formed over the base film 103. An amorphous semiconductor, a semi-amorphous semiconductor, or a polycrystalline semiconductor may be used for the semiconductor film 104. In addition, not only silicon but also silicon germanium can be used for the semiconductor film 104.

Figure 1B:
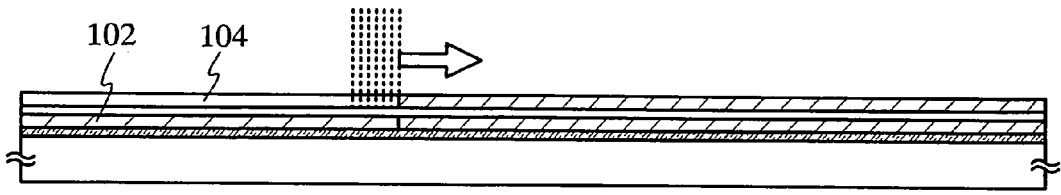

As shown in FIG. 1B, laser crystallization of the semiconductor film 104 is performed. A pulsed laser with repetition rates of 10 MHz or more in addition to a continuous-wave laser can also be used for the laser crystallization. When the laser crystallization of the semiconductor film 104 is performed, the peeling layer 102 is crystallized as well.

Figure 1C:
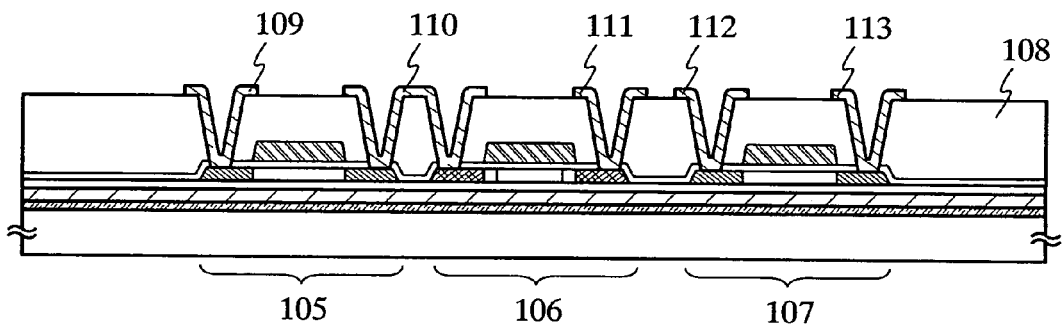

As shown in FIG. 1C, a semiconductor element is formed by using the crystallized semiconductor film 104. FIG. 1C shows an example of forming TFTs 105 to 107 as a semiconductor element; however, the invention is not limited thereto. A semiconductor element except a TFT, for example, a memory element, a diode, a photoelectric conversion element, a resistance element, a coil, a capacitor element, an inductor, or the like can also be formed in stead of the TFTs.

The TFTs 105 to 107 are covered with an interlayer insulating film 108, and wirings 109 to 113 are formed over the interlayer insulating film 108. The wirings 109 to 113 are connected to the TFTs 105 to 107 through a contact hole formed in the interlayer insulating film 108.

Figure 1D:
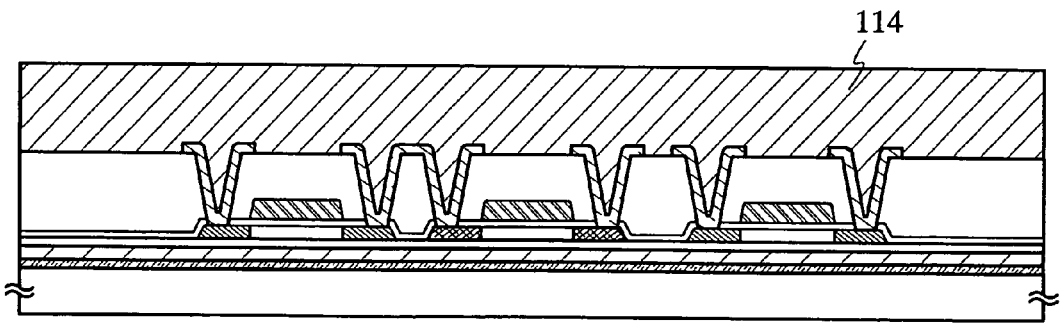

As shown in FIG. 1D, a protective layer 114 is formed to cover the TFTs 105 to 107 and the wirings 109 to 113. It is desirable to form the protective layer 114 from a material that can protect a semiconductor element and a wiring connected thereto (herein, the TFTs 105 to 107 and the wirings 109 to 113) in a subsequent step of peeling a semiconductor element, and that can be removed after the peeling step. For example, epoxy-based, acrylate-based, or silicon-based resin soluble in water or alcohols can be used for the protective layer 114.

Figure 2A:
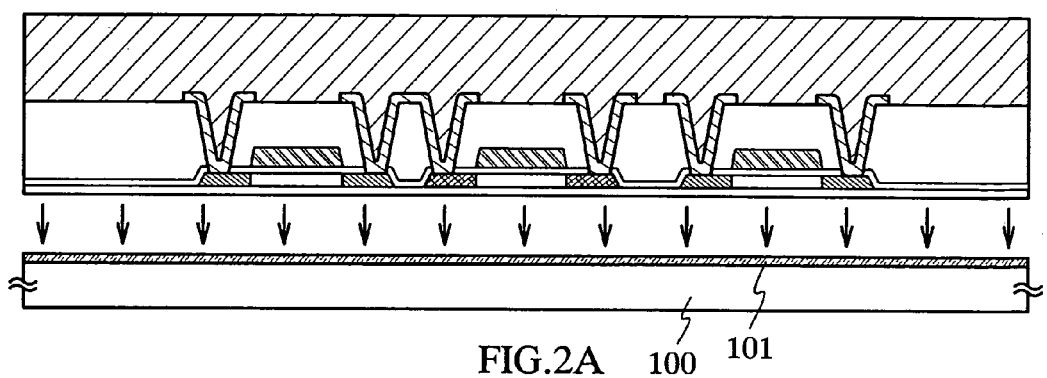
FIGS. 2A and 2B are cross-sectional views showing a method for manufacturing a semiconductor device according to certain aspects of the present invention.

As shown in FIG. 2A, the peeling layer 102 is removed by etching, and a peeling step in which the first substrate 100 and the buffer film 101 are peeled from the TFTs 105 to 107 are performed. Gas or liquid containing halide can be typically used as an etchant when silicon is used for the peeling layer 102, for example. Specifically, for example, $ClF_3$ (chlorine trifluoride), $NF_3$ (nitrogen trifluoride), $BrF_3$ (bromine trifluoride), HF (hydrogen fluoride), or a gas in which $ClF_3$, $NF_3$, $BrF_3$, or HF is mixed with nitrogen can be used. Note that a silicon oxide film is used for the peeling layer in the case of using HF.

Figure 2B:
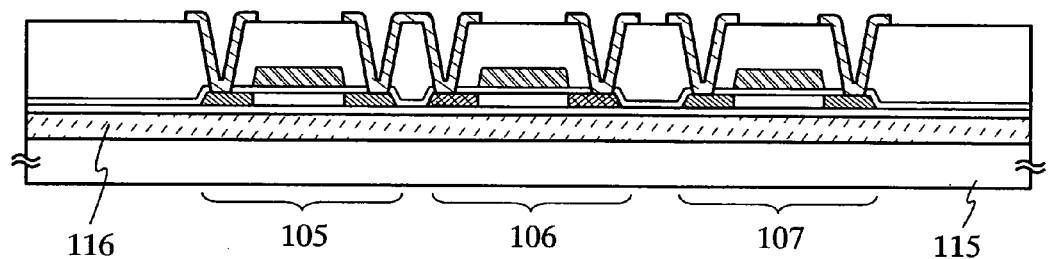

As shown in FIG. 2B, the TFTs 105 to 107 are attached to a second substrate 115 by using an adhesive 116 and the protective layer 114 is removed.

A semiconductor element such as the TFTs 105 to 107 can be formed over the second substrate 115 even when the second substrate 115 is inferior in heat resistance by using the above serial manufacturing method.

Note that, in the above peeling step, a groove may be formed in the interlayer insulating film 108, the protective layer 114, and the base film 103 to expose the peeling layer 102 partially in order to shorten the time spent on removing the peeling layer 102. A dicing method, a scribing method, a photolithography method, or the like can be used to form the groove.

In the above manufacturing method, the peeling layer 102 is crystallized as well when laser crystallization of the semiconductor film 104 is performed, which is superior in terms of reducing the number of steps and simplifying the steps. However, the invention is not limited to the structure in which laser crystallization of the peeling layer 102 is performed concurrently with the semiconductor film 104. A crystalline peeling layer 102 may be formed in advance, or, a peeling layer 102 may be crystallized before forming a semiconductor film 104. For example, laser crystallization of the peeling layer 102 may be performed by using a pulsed laser with repetition rates of less than 10 MHz which is superior in throughput. On the other hand, laser crystallization of the semiconductor film 104 may be performed by using a pulsed laser with repetition rates of 10 MHz or more or a continuous-wave laser which can enhance crystallinity remarkably. However, when the laser crystallization of the peeling layer 102 is performed, it is desirable that laser light irradiation is performed after the base film 103 is formed in order to prevent projection (a ridge) from being generated at a crystal grain boundary.

When the peeling layer 102 having crystallinity is formed in advance or the peeling layer 102 is crystallized before forming the semiconductor film 104, the crystallization of the semiconductor film 104 is not limited to laser crystallization using a pulsed laser with repetition rates of 10 MHz or more or a continuous-wave laser. For example, a laser crystallization method using a pulsed laser with repetition rates of less than 10 MHz, a crystallization method using a catalytic element, or a crystallization method combining the crystallization method using a catalyst element and the laser crystallization method can be used. When a substrate superior in heat resistance such as a quartz substrate is used for the first substrate 100, a thermal crystallization method using an electrically heated furnace, a lamp annealing crystallization method using infrared light, or a crystallization method combining a crystallization method using a catalyst element and high-temperature annealing of approximately 950° C. may also be used.

In the case of using silicon for the peeling layer 102, the etching rate of the peeling layer 102 can be further enhanced by adding p-type impurities (for example, B) or n-type impurities (for example, P) into the peeling layer 102 by doping or the like to activate.

The base film 103 may be formed by using a single insulating film or a plurality of insulating films. It is effective to use silicon nitride or silicon nitride oxide with high barrier properties in order to prevent alkali metal such as Na or alkaline earth metal from diffusing into the semiconductor film 104. However, silicon nitride or silicon nitride oxide is inferior to silicon oxide or silicon oxynitride in terms of adhesion with silicon. Accordingly, in the case of using silicon for the peeling layer 102, among a plurality of insulating films included in the base film 103, it is desirable to use silicon oxide or silicon oxynitride for an insulating film being in contact with the peeling layer 102 and to use silicon nitride or silicon nitride oxide for any of the rest of the insulating films of the base film 103. According to the above structure, the adhesion between the peeling layer 102 and the base film 103 can be enhanced and alkali metal or alkaline earth metal can be prevented from diffusing into the semiconductor film 104.

In the case of using silicon for the semiconductor film 104, among a plurality of insulating films included in the base film 103, it is desirable to use silicon oxide or silicon oxynitride for an insulating film being in contact with the semiconductor film 104 and to use silicon nitride or silicon nitride oxide for any of the rest of the insulating films of the base film 103. According to the above structure, the adhesion between the semiconductor film 104 and the base film 103 can be enhanced and alkali metal or alkaline earth metal can be prevented from diffusing into the semiconductor film 104.

Alternatively, in the case of using silicon both for the peeling layer 102 and semiconductor film 104, among a plurality of insulating films included in the base film 103, it is desirable to use silicon oxide or silicon oxynitride for an insulating film being in contact with the peeling layer 102 and the insulating film being in contact with the semiconductor film 104 and to use silicon nitride or silicon nitride oxide for any of the rest of the insulating films of the base film 103. According to the above structure, the adhesive between the peeling layer 102 and the base film 103 and the adhesive between the semiconductor film 104 and the base film 103 can be enhanced and alkali metal or alkaline earth metal can be prevented from diffusing into the semiconductor film 104.

[Embodiment 1]

Next, this embodiment describes a detailed method for manufacturing an ID chip which is one of semiconductor devices employing a manufacturing method of the present invention. Note that this embodiment shows an insulated TFT as an example of semiconductor elements; however, a semiconductor element used for an integrated circuit is not limited thereto and all circuit elements can be used.

Figure 3A:
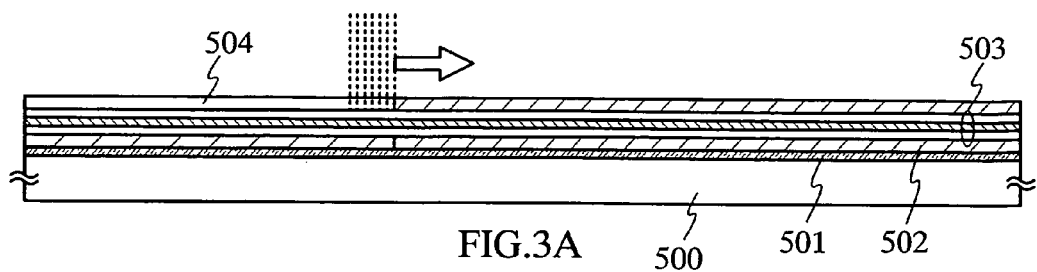
FIGS. 3A to 3E are cross-sectional views showing a method for manufacturing a semiconductor device according to certain aspects of the present invention.

First, as shown in FIG. 3A, a buffer film 501 is formed on a heat-resistant first substrate 500. For example, a glass substrate such as a barium borosilicate glass or an alumino borosilicate glass, a quartz substrate, a ceramic substrate, or the like can be used for the first substrate 500. Alternatively, a metal substrate including a stainless substrate or a semiconductor substrate may also be used. Although a substrate made of flexible synthetic resin such as plastics generally tends to be inferior in heat-resistant temperature as compared with the above substrates, the substrate made of flexible synthetic resin can be used as long as it can withstand the processing temperature in the manufacturing steps.

An insulating film is preferably used for the buffer film 501 as long as it can relieve the stress on a peeling layer 502 which is to be subsequently formed and can enhance adhesion between the first substrate 500 and the peeling layer 502. The buffer film 501 can be formed, for example, from silicon oxide or silicon oxynitride. In this embodiment, a mixed gas of $SiH_4/N_2O$ at a flow rate of 4/800 sccm is used and the buffer film 501 made of silicon oxynitride is formed by a plasma CVD method.

Note that this embodiment shows an example in which the buffer film 501 is formed of a single insulating film; however, the invention is not limited to this structure. The buffer film 501 may be formed of a plurality of insulating films.

Next, the peeling layer 502 is formed to be in contact with the buffer film 501. A layer containing silicon such as amorphous silicon, polycrystalline silicon, single crystal silicon, and microcrystallite silicon (including a semi-amorphous silicon) as the main component can be used for the peeling layer 502. The peeling layer 502 can be formed by using a sputtering method, a low-pressure CVD method, a plasma CVD method, or the like. In this embodiment, amorphous silicon having a film thickness of approximately 50 nm is formed by a plasma CVD method, which is used as the peeling layer 502. Dust and dirt are prevented from entering the peeling layer 502 and the amount of Ar contained in the peeling layer 502 can be reduced when it is formed by a plasma CVD method as compared with the case of a sputtering method. Therefore, even when heat treatment including laser crystallization or the like is applied to the peeling layer 502 in a subsequent manufacturing step, the peeling layer 502 can be kept from being peeled from the buffer film 501 or a base film 503 due to dust and dirt, or Ar. When dust and dirt is contained in the peeling layer 502, minute projections and/or depressions may be generated due to the dust and dirt on the surface of a semiconductor film 504 which is to be subsequently formed. When there are projections and/or depressions due to dust and dirt on the surface of the semiconductor film 504, the semiconductor film 504 may be peeled when laser crystallization of the semiconductor film 504 is performed. In addition, when Ar is contained in the peeling layer 502, the semiconductor film 504 may be peeled by laser energy. Thus, the semiconductor film 504 can be prevented from being peeled from the base film 503 during laser crystallization by forming the peeling layer 502 using a plasma CVD method. Note that the material of the peeling layer 502 is not limited to silicon and the peeling layer 502 may be formed from a material that can be selectively removed by etching. It is desirable that the film thickness of the peeling layer 502 is set to be from 10 nm to 100 nm.

The base film 503 is formed over the peeling layer 502. The base film 503 is provided to prevent alkali metal such as Na or alkaline earth metal that is contained in the first substrate 500 from diffusing into the semiconductor film 504 to be subsequently formed and causing an adverse effect on characteristics of a semiconductor element such as a TFT. In addition, the base film 503 also has a role to protect a semiconductor element in a subsequent step of peeling a semiconductor element. For example, an insulating film such as silicon oxide, silicon oxynitride, silicon nitride, or silicon nitride oxide can be used for the base film 503.

The base film 503 may be formed by using a single insulating film or a lamination of a plurality of insulating films. In this embodiment, the base film 503 is formed by sequentially laminating a 100 nm thick silicon oxynitride film, a 50 nm thick silicon nitride oxide film, and a 100 nm thick silicon oxynitride film; however, the materials, film thickness, and numbers of laminations of each film are not limited thereto. For example, siloxane-based resin with film thickness of from 0.5 μm to 3 μm may also be formed by a spin coating method, a slit coating method, a droplet discharge method, a printing method, or the like instead of the silicon oxynitride film in the lower layer. Silicon nitride film ($SiN_x$, $Si_3N_4$, or the like) may also be used instead of the silicon nitride oxide film in the middle layer. In addition, silicon oxide film may also be used instead of the silicon oxynitride film in the upper layer. Furthermore, it is desirable that each film thickness ranges from 0.05 μm to 3 μm, and each film thickness can be selected from the range arbitrarily.

Note that the droplet discharge method is defined as a method for forming a predetermined pattern by discharging a droplet containing a predetermined composition from a minute hole, which includes an ink-jet method and the like in its category. In addition, a screen-printing method, an offset printing method, and the like is included in the printing method.

Alternatively, the lower layer of the base film 503 which is the nearest to the peeling layer 502 may be formed of a silicon oxynitride film or a silicon oxide film, the middle layer may be formed of siloxane-based resin, and the upper layer may be formed of a silicon oxide film.

Note that the siloxane-based resin is defined as resin containing Si—O—Si bond. The siloxane-based resin includes an organic group at least containing hydrogen (for example, an alkyl group or aromatic hydrocarbon) as a substituent. Alternatively, a fluoro group may also be included as the substituent. Furthermore, an organic group at least containing hydrogen and a fluoro group may also be included as the substituent.

A mixed gas such as $SiH_4/O_2$ or TEOS (tetraethoxysilane)/$O_2$ is used for the silicon oxide film, which can be formed by a method such as a thermal CVD method, a plasma CVD method, an atmospheric pressure CVD method, or a bias ECRCVD method. In addition, a mixed gas of $SiH_4/NH_3$ is typically used for the silicon nitride film, which can be formed by a plasma CVD method. A mixed gas of $SiH_4/N_2O$ is typically used for the silicon oxynitride film and the silicon nitride oxide film, which can be formed by a plasma CVD method.

Next, the semiconductor film 504 is formed over the base film 503. It is desirable that the semiconductor film 504 is formed without being exposed to an atmosphere after forming the base film 503. The film thickness of the semiconductor film 504 is set to be from 20 nm to 200 nm (preferably from 40 nm to 170 nm, and more preferably from 50 nm to 150 nm). Note that an amorphous semiconductor, a semi-amorphous semiconductor, or a polycrystalline semiconductor may be used for the semiconductor film 504. Alternatively, not only silicon but also silicon germanium can be used for the semiconductor film 504. In the case of using silicon germanium, the concentration of germanium is preferably approximately from 0.01 atomic % to 4.5 atomic %.

Then, laser crystallization of the semiconductor film 504 is performed. When laser crystallization is performed, it is desirable that heat treatment at 550° C. for 4 hours is applied to the semiconductor film 504 in order to enhance resistance of the semiconductor film 504 to a laser before performing the laser crystallization. A continuous-wave laser or a pulsed laser with repetition rates of 10 MHz or more can be used for the laser crystallization.

Specifically, a known continuous-wave gas laser or solid-state laser can be used. An Ar laser, a Kr laser, and the like can be given as an example of the gas lasers. The following can be given as an example of the solid-state laser: a YAG laser, a $YVO_4$ laser, a YLF laser, a $YAlO_3$ laser, a $Y_2O_3$ laser, a glass laser, a ruby laser, an alexandrite laser, a Ti: sapphire laser, and the like.

When pulsed oscillation can be performed with repetition rates of 10 MHz or more, the following laser can be used: an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, a gold vapor laser, or the like.

For example, when a solid-state laser capable of a continuous oscillation is used, a crystal with a large grain size can be obtained by irradiating the semiconductor film 504 with laser light in the second harmonic to the fourth harmonic. Typically, it is desirable to use the second harmonic (532 nm) or the third harmonic (355 nm) of a YAG laser (fundamental wave: 1064 nm). Specifically, laser light irradiated from a continuous-wave YAG laser is converted to a harmonic through a non-linear optical element, and laser light having output ranging approximately from 4 W to 8 W is obtained, for example. The semiconductor film 504 is irradiated when the laser light is preferably shaped on an irradiated surface to be a rectangular shape or an elliptical shape by an optical system. The energy density ranging approximately from 0.01 $MW/cm^2$ to 100 $MW/cm^2$ (preferably, from 0.1 $MW/cm^2$ to 10 $MW/cm^2$) are required. Then, irradiation is performed under the scanning speeds ranging approximately from 10 cm/sec to 2000 cm/sec. In this embodiment, crystallization is performed under energy of 5 W, beam spot sizes of 400 μm in a major axis and 10 μm to 20 μm in a minor axis, and the scanning speed of 35 cm/sec.

According to the above laser crystallization, the crystal grain of which width in a direction perpendicular to the scanning direction is approximately several hundreds μm and which is grown to extend in the scanning direction can be obtained.

The narrower the width of the beam spot of the laser light is in the scanning direction, the wider the difference (margin) between the minimum value of energy density of the laser light in which peeling of the semiconductor film 504 by laser crystallization is generated and the energy density value in order to obtain a crystal as designed can be. Thus, the semiconductor film 504 can be crystallized without being peeled even when projections and/or depressions are generated on the surface of the semiconductor film 504 by dust, dirt, and the like. Therefore, it is desirable that the width of the beam spot in the scanning direction is narrowed as much of adjustment of an optical system as possible.

Figure 8:
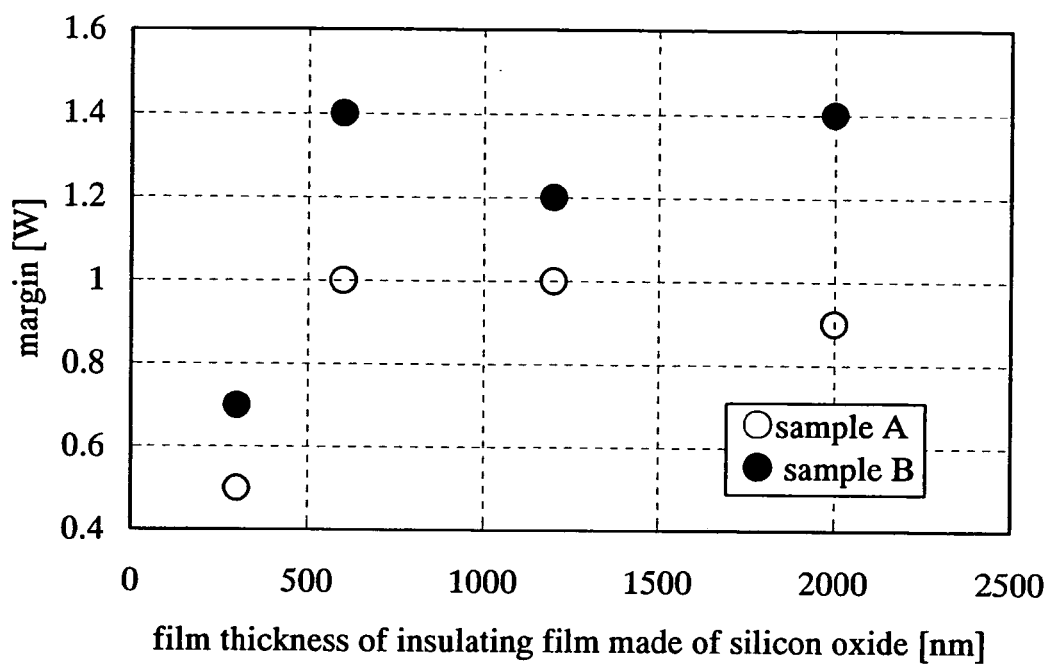
FIG. 8 is a graph showing an energy margin when a semiconductor film is crystallized with a continuous-wave laser.

In addition, the thicker the film thickness of the base film 503 is, the more the stress on the semiconductor film 504 to be subsequently formed can be relieved; therefore, the margin of the energy density of the laser light can be enlarged. Table 1 below and FIG. 8 show an energy margin when a semiconductor film is crystallized with a continuous-wave laser in a sample formed by laminating a buffer film, a peeling layer, a base film, and a semiconductor film sequentially over a glass substrate. In this specification, the margins were compared by using W (watt) for convenience. However, since the beam spot size of laser light is made the same in all samples, the magnitude relation between each sample in an energy margin means the relative magnitude relation in the margin of energy density.

TABLE 1

| film thickness of insulating film made of silicon oxide [nm] | margin of sample A [W] | margin of sample B [W] |
|---|---|---|
| 300 | 0.5 | 0.7 |
| 600 | 1 | 1.4 |
| 1200 | 1 | 1.2 |
| 2000 | 0.9 | 1.4 |

Specifically, in each sample, a 100 nm thick buffer film made of silicon oxynitride is formed over a glass substrate by using a plasma CVD method, a 50 nm thick peeling layer made of amorphous silicon is formed over the buffer film by using a plasma CVD method, and an insulating film made of silicon oxide is formed over the peeling layer by using a plasma CVD method. In addition, a 50 nm thick insulating film made of silicon nitride oxide is formed over the insulating film made of silicon oxide by using a plasma CVD method, and a 100 nm thick insulating film made of silicon oxynitride is formed over the insulating film made of silicon nitride oxide by using a plasma CVD method. The insulating films made of silicon oxide, silicon nitride oxide, and silicon oxynitride correspond to a base film. In addition, a 66 nm thick semiconductor film made of amorphous silicon is formed over the insulating film made of silicon oxynitride by using a plasma CVD method.

In FIG. 8, a horizontal axis shows the film thickness of the insulating film made of silicon oxide and a vertical axis shows the margin when laser crystallization of the semiconductor film is performed. Note that only laser crystallization is performed to a sample A, and laser crystallization is performed to a sample B after crystallizing it by using a catalyst element. According to Table 1 and FIG. 8, it can be seen that the thicker the film thickness of the insulating film made of silicon oxide is, the wider the margin is, when the film thickness is 600 nm or less. It can be seen that the margin is adequate when the film thickness of the insulating film made of silicon oxide is 600 nm or more. Therefore, the thicker the film thickness of the insulating film made of silicon oxide is, the more uniformly the semiconductor film can be crystallized even when projections and/or depressions are generated on the surface of the substrate.

The thicker the film thickness of the semiconductor film is, the larger the margin of energy density of the laser light is. Therefore, the thicker the film thickness of the semiconductor film is, the more the semiconductor film can be crystallized uniformly even when projections and/or depressions are generated on the surface of the substrate.

When a continuous-wave laser is used, a region inferior in crystallinity with an extremely smaller crystal grain compared with the center of the beam spot (microcrystallite region) is formed at the both ends of the beam spot in the direction vertical to the scanning direction. The thicker the film thickness of the semiconductor film is, the more the microcrystallite region can be reduced in area. In addition, the thinner the film thickness of the peeling layer is, the more the microcrystallite region can be reduced in area. Therefore, it is desirable to adjust the film thickness of the semiconductor film and the peeling layer in order to reduce the microcrystallite region in area. Alternatively, it is also possible to reduce the microcrystallite region in area by shielding a region having low energy density of the beam spot with a slit or the like instead of adjusting the film thickness of the semiconductor film and the peeling layer.

The buffer film 501, the peeling layer 502, the base film 503, and the semiconductor film 504 can be formed continuously over the first substrate 500 without being exposed to an atmosphere. The dust and dirt in an atmosphere or impurities can be prevented from entering each layer or between the layers by continuously forming them without being exposed to an atmosphere. However, if a large amount of hydrogen is contained in the peeling layer 502, the peeling layer 502 tends to be peeled when heat treatment such as laser crystallization is subsequently applied. Thus, it is desirable to reduce the amount of hydrogen contained in the peeling layer 502 by performing heat treatment after forming the peeling layer 502 if the prevention of the peeling layer 502 from being peeled is to be emphasized.

Note that the laser crystallization may be performed by irradiating the semiconductor film with continuous-wave laser light in a fundamental wave and continuous-wave laser light in a harmonic concurrently, or, by irradiating the semiconductor film with continuous-wave laser light in a fundamental wave and pulsed laser light in a harmonic concurrently.

Alternatively, the semiconductor film may be irradiated with laser light in an atmosphere containing an inert gas such as a rare gas or nitrogen. Accordingly, the rough surface of the semiconductor film due to laser light irradiation can be suppressed and the fluctuation in a threshold value voltage of a TFT due to the variation of the interface level density can be suppressed.

The crystallinity of the semiconductor film 504 is enhanced by the laser light irradiation mentioned above. Note that a polycrystalline semiconductor may be formed in advance by a sputtering method, a plasma CVD method, a thermal CVD method, or the like.

Note that the amorphous semiconductor can be obtained by performing grow discharge decomposition of a silicide gas. $SiH_4$ and $Si_2H_6$ are given as an example of typical silicide gases. The silicide gas may be used by diluting with hydrogen or hydrogen and helium.

Note that the semi-amorphous semiconductor is defined as a film including a semiconductor with an intermediate structure between an amorphous semiconductor and a semiconductor with a crystal structure (including a single crystal and a polycrystal). This semi-amorphous semiconductor is a semiconductor having a third condition that is stable like a free energy and a crystalline semiconductor having a short-range order and lattice distortion, of which grain size is set to be from 0.5 nm to 20 nm, and can exist by being dispersed in a non-single crystalline semiconductor. Raman spectrum of a semi-amorphous semiconductor is shifted to a lower wave number side less than 520 cm$^{-1}$. Diffraction peak of (111) or (220) to be caused from a crystal lattice of silicon is observed in X-ray diffraction. At least 1 atomic % or more of hydrogen or halogen is contained to terminate a dangling bond. Here, such a semiconductor is referred to as a semi-amorphous semiconductor (SAS) for convenience. Furthermore, a preferable semi-amorphous semiconductor with increased stability can be obtained by further promoting lattice distortion to contain a rare gas element such as helium, argon, krypton, or neon.

In addition, a SAS can be obtained by performing grow discharge decomposition of a silicide gas. A typical silicide gas is $SiH_4$, and besides, $Si_2H_6$, $SiH_2Cl_2$, $SiHCl_3$, $SiCl_4$, $SiF_4$, or the like can be used. In addition, a SAS can be easily formed by using this silicide gas diluted with hydrogen or hydrogen added with one or a plurality of rare gas elements of helium, argon, krypton, and neon. The silicide gas is preferably diluted under the dilution ratio ranging from 2 times to 1000 times. Furthermore, the energy band width of the silicide gas may be adjusted from 1.5 eV to 2.4 eV or from 0.9 eV to 1.1 eV by mixing a carbide gas such as $CH_4$ or $C_2H_6$, a germanium gas such as $GeH_4$ or $GeF_4$, or $F_2$, or the like in the silicide gas.

For example, in the case of using $SiH_4$ gas added with $H_2$ or using $SiH_4$ gas added with $F_2$, a TFT is manufactured using a semi-amorphous semiconductor that is formed. In that case, a subthreshold coefficient (S-value) of the TFF can be set to be 0.35 V/sec or less, typically from 0.25 V/sec to 0.09 V/sec and the mobility can be set to be 10 cm$^2$/Vsec. For example, when a 19-stage ring oscillator is formed with the above TFT using the semi-amorphous semiconductor, characteristics of the repetition rates of 1 MHz or more, preferably 100 MHz or more can be obtained at the power supply voltages ranging from 3 V to 5 V. In addition, a delay time per stage of an inverter can be set to be 26 ns, preferably 0.26 ns or less at the power supply voltages ranging from 3 V to 5 V.

Figure 3B:
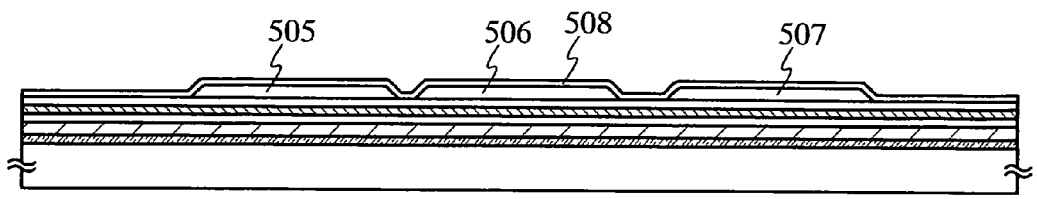

As shown in FIG. 3B, the crystallized semiconductor film 504 is patterned to form island-shape semiconductor films 505 to 507. Then, a gate insulating film 508 is formed to cover the island-shape semiconductor films 505 to 507. The gate insulating film 508 can be formed as a single layer or a lamination of a film containing silicon nitride, silicon oxide, silicon nitride oxide, or silicon oxynitride by using a plasma CVD method, a sputtering method, or the like. In the case of a lamination, for example, it is preferable to apply a three-layer structure in which a silicon oxide film, a silicon nitride film, and a silicon oxide film are laminated over a substrate.

Figure 3C:
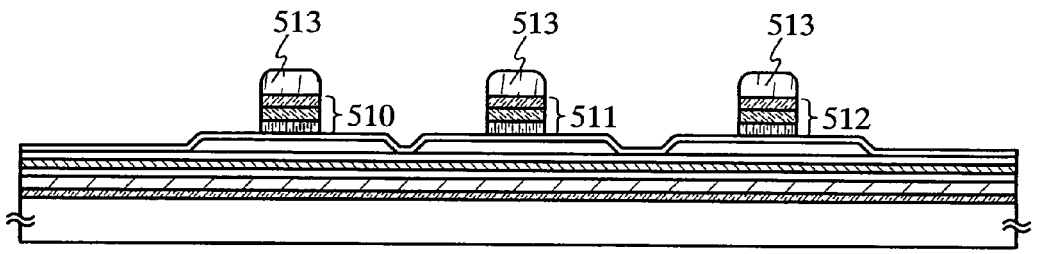

As shown in FIG. 3C, gate electrodes 510 to 512 are formed. In this embodiment, silicon doped with impurities imparting n-type conductivity, WN, and W are sequentially laminated by a sputtering method. Thereafter, a resist 513 is used as a mask to form the gate electrodes 510 to 512 by etching. Of course, the material, structure, and manufacturing method of the gate electrodes 510 to 512 are not limited thereto and can be arbitrarily selected. For example, a laminated structure of silicon doped with impurities imparting n-type conductivity and NiSi (nickel silicide), a laminated structure of Si (Silicon) doped with impurities imparting n-type conductivity and WSix (tungsten silicide), and a laminated structure of TaN (tantalum nitride) and W (tungsten) may be employed. Alternatively, the gate electrodes 510 to 512 may be formed to be a single layer by using various conductive materials.

In addition, a mask made of silicon oxide or the like may be used instead of the resist mask. In this case, a step of forming a mask made of silicon oxide, silicon oxynitride, or the like by patterning (referred to as a hard mask) is added. However, loss in film thickness of the mask is fewer during etching than the case of the resist mask; therefore, the gate electrodes 510 to 512 having a desired width can be formed. Alternatively, the gate electrodes 510–512 may be formed selectively by using a droplet discharge method without using the resist 513.

Various materials can be selected for the conductive material according to the function of the conductive film. When the gate electrodes and an antenna are simultaneously formed, materials may be selected in consideration of the function thereof.

Note that a mixed gas of $CF_4$, $Cl_2$, and $O_2$ or a $Cl_2$ gas is used as an etching gas when the gate electrodes 510 to 512 are formed by etching; however, the etching gas is not limited thereto.

Figure 3D:
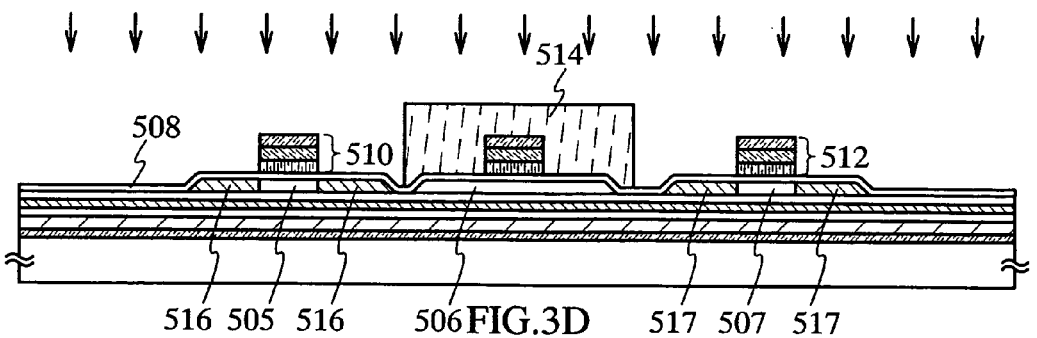

As shown in FIG. 3D, the island-shape semiconductor film 506 which is to become a p-channel TFT is covered with a resist 514, and an impurity element imparting n-type conductivity (typically, P (phosphorus) or As (arsenic)) is doped to the island-shape semiconductor films 505 and 507 to form a low-concentration region by using the gate electrodes 510 and 512 as masks (a first doping step). The condition of the first doping step is performed under dose amounts ranging from $1\times10^{13}/cm^2$ to $6\times10^{13}/cm^2$ and accelerating voltages ranging from 50 keV to 70 keV; however, the condition of the first doping step is not limited thereto. The doping is performed through the gate insulating film 508 according to this first doping step, and pairs of low-concentration impurity regions 516 and 517 are formed in the island-shape semiconductor films 505 and 507. Note that the first doping step may be performed without covering the island-shape semiconductor film 506, which is to become a p-channel TFT, with resist.

Figure 3E:
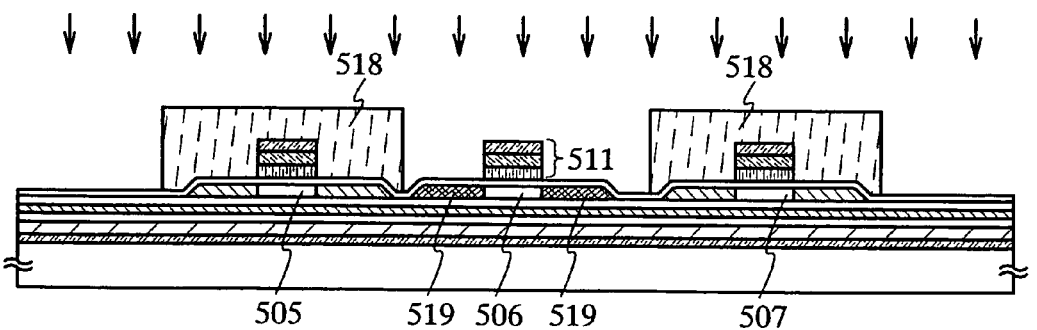

As shown in FIG. 3E, a resist 518 is newly formed to cover the island-shape semiconductor films 505 and 507 which are to be n-channel TFTs after removing the resist 514 by ashing or the like. An impurity element imparting p-type conductivity (typically, B (boron)) is doped in high concentration to the island-shape semiconductor film 506 by using a gate electrode 511 as a mask (a second doping step). The condition of the second doping step is performed under dose amounts ranging from $1\times10^{16}/cm^2$ to $3\times10^{16}/cm^2$ and accelerating voltages ranging from 20 keV to 40 keV. The doping is performed through a gate insulating film 508 according to this second doping step, and a pair of high-concentration impurity regions 519 is formed in the island-shape semiconductor film 506.

Figure 4A:
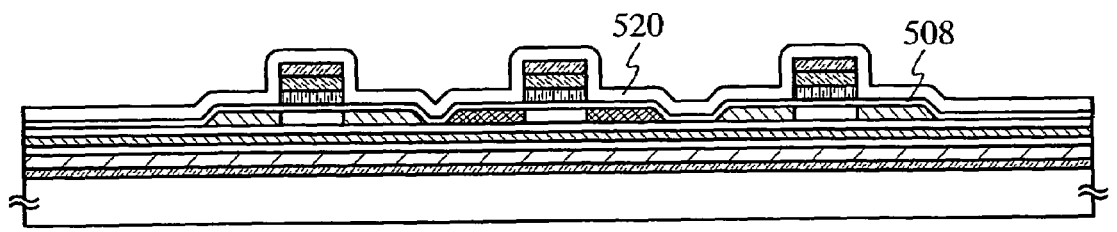
FIGS. 4A to 4E are cross-sectional views showing a method for manufacturing a semiconductor device according to certain aspects of the present invention.
Figure 4B:
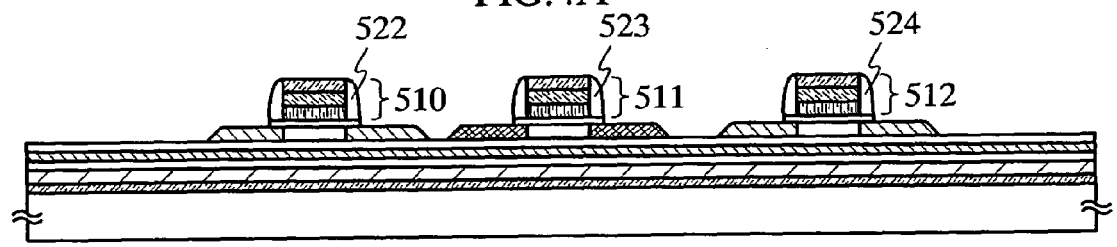

As shown in FIG. 4A, an insulating film 520 is formed to cover the gate insulating film 508 and the gate electrodes 510 to 512 after removing the resist 518 by ashing or the like. In this embodiment, a 100 nm thick silicon oxide film is formed by a plasma CVD method. Thereafter, the insulating film 520 and the gate insulating film 508 are partially etched by an etching back method, and then, sidewalls 522 to 524 are formed in a self-aligned manner to be in contact with the sidewalls of the gate electrodes 510 to 512 as shown in FIG. 4B. A mixed gas of $CHF_3$ and He is used as the etching gas. Note that the sidewalls 522 to 524 are not limited thereto.

In the case an insulating film is formed also on the backside of the first substrate 500 when the insulating film 520 is formed, the insulating film formed on the backside may be selectively etched and removed by using resist. In this case, the resist to be used may etch the insulating film 520 and the gate insulating film 508 concurrently to be removed when the sidewalls 522 to 524 are formed by an etching back method.

Figure 4C:
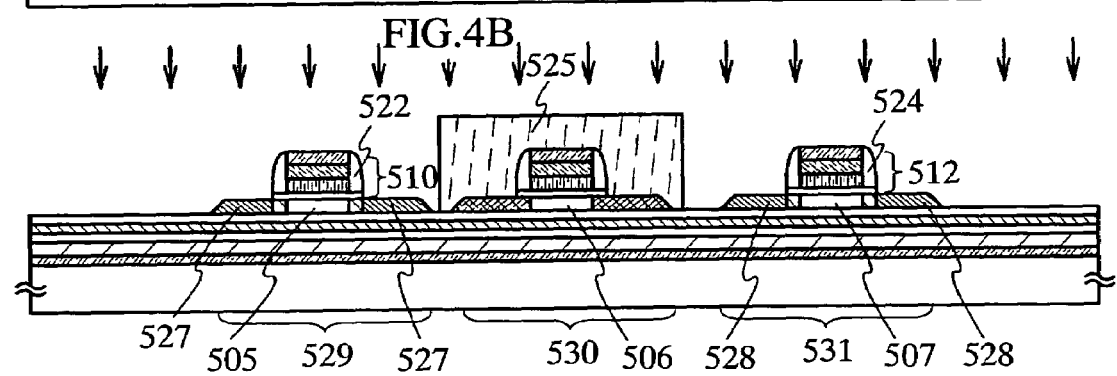

As shown in FIG. 4C, a resist 525 is newly formed to cover the island-shape semiconductor film 506 which is to become a p-channel TFT, and an impurity element imparting n-type conductivity (typically, P or As) is doped in high concentration by using the gate electrodes 510 and 512 and the sidewalls 522 and 524 as masks (a third doping step). The condition of the third doping step is performed under dose amounts ranging from $1\times10^{13}$ to $5\times10^{15}/cm^2$ and accelerating voltages ranging from 60 keV to 100 keV. Pairs of n-type high-concentration impurity regions 527 and 528 are formed in the island-shape semiconductor films 505 and 507 according to this third doping step.

Note that the sidewalls 522 and 524 function as masks when, subsequently, high-concentration impurities imparting n-type conductivity is doped and a low-concentration impurity region or a non-doping offset region is formed below the sidewalls 522 and 524. Thus, the size of the sidewalls 522 and 524 is preferably adjusted by appropriately changing the condition of an etching back method or the film thickness of the insulating film 520 when the sidewalls 522 and 524 are formed in order to control the width of the low-concentration impurity region or the offset region.

Next, the impurity region may be activated by heat treatment after removing the resist 525 by ashing or the like. For example, heat treatment may be performed under a nitrogen atmosphere at 550° C. for 4 hours after forming a 50 nm thick silicon oxynitride film.

In addition, a step of hydrogenating the island-shape semiconductor films 505 to 507 may be performed by performing heat treatment under a nitrogen atmosphere at 410° C. for 1 hour after forming a 100 nm thick silicon nitride film containing hydrogen. Alternatively, the step of hydrogenating the island-shape semiconductor films 505 to 507 may be performed by performing heat treatment at temperatures ranging from 300° C. to 450° C. for an hour to 12 hours in an atmosphere containing hydrogen. Plasma hydrogenation (using hydrogen excited by plasma) may be performed as other hydrogenation means. Through this hydrogenating step, a dangling bond can be terminated by hydrogen thermally excited. Although the defect is generated in the island-shape semiconductor films 505 to 507 by curving a flexible second substrate 548 after attaching a semiconductor element over the flexible second substrate 548 in a subsequent step, the hydrogen concentration of the island-shape semiconductor films 505 to 507 is set to be from $1\times10^{19}$ atoms/$cm^3$ to $1\times10^{22}$ atoms/$cm^3$, preferably from $1\times10^{19}$ atoms/$cm^3$ to $5\times10^{20}$ atoms/$cm^3$ so that the defect can be terminated by hydrogen contained in the island-shape semiconductor films 505 to 507. Alternatively, halogen may also be contained in the island-shape semiconductor films 505 to 507 in order to terminate the defect.

An n-channel TFT 529, a p-channel TFT 530, and an n-channel TFT 531 are formed through the above serial steps. In above manufacturing steps, the condition of an etching back method or the film thickness of the insulating film 520 is appropriately changed and the size of the sidewalls 522 and 524 is adjusted; therefore, a TFT with a channel length ranging from 0.2 μm to 2 μm can be formed. Note that this embodiment employs a top gate structure for the n-channel TFTs 529 and 531, and the p-channel TFT 530; however, a bottom gate structure (reverse stagger structure) may be employed.

Furthermore, a passivation film to protect the n-channel TFTs 529 and 531, and the p-channel TFT 530 may be formed thereafter. It is desirable to use silicon nitride, silicon nitride oxide, aluminum nitride, aluminum oxide, silicon oxide, or the like which can prevent alkali metal or alkaline earth metal from entering the n-channel TFTs 529 and 531, and the p-channel TFT 530 for the passivation film. Specifically, for example, a 600 nm thick silicon oxynitride film can be used for the passivation film. In this case, a hydrogenation treatment step may be performed after forming the silicon oxynitride film. In such a manner, three-layers insulating films of silicon oxynitride, silicon nitride, and silicon oxynitride are sequentially to be laminated over the n-channel TFTs 529 and 531, and the p-channel TFT 530; however, the structure and material are not limited thereto. The n-channel TFTs 529 and 531, and the p-channel TFT 530 are covered with the base film 503 and the passivation film by employing the above structure. Therefore, alkali metal such as Na or alkaline earth metal can be prevented from diffusing into the island-shape semiconductor films 505 to 507 used for a semiconductor element and causing an adverse effect on characteristics of the semiconductor element.

Figure 4D:
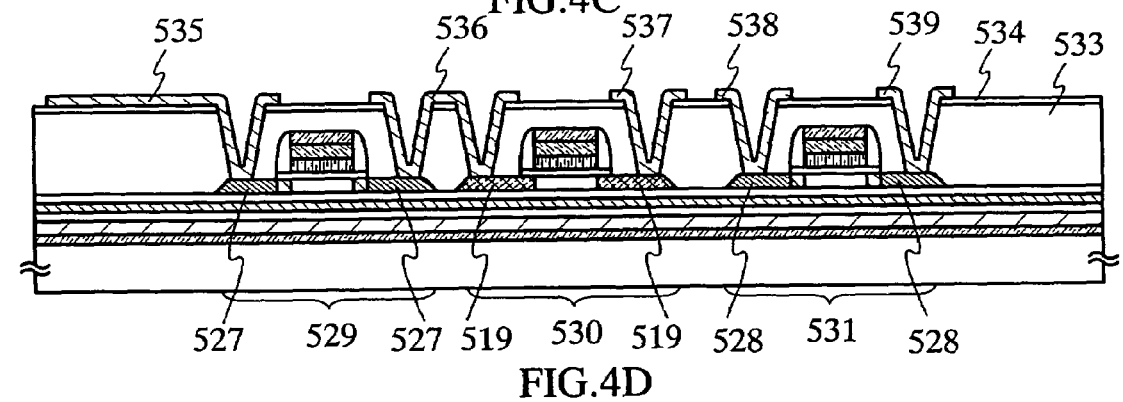

As shown in FIG. 4D, a first interlayer insulating film 533 is formed to cover the n-channel TFTs 529 and 531, and the p-channel TFT 530. Heat-resistant organic resin such as polyimide, acrylic, or polyamide can be used for the first interlayer insulating film 533. A low dielectric constant material (low-k material), a siloxane-based material, or the like can be used besides the above organic resin. The siloxane-based resin may include an organic group at least containing hydrogen (for example, an alkyl group or aromatic hydrocarbon), a fluoro group, or an organic group at least containing hydrogen and a fluoro group as the substituent. When the first interlayer insulating film 533 is formed, a spin coating method, a dipping method, a spray coating method, a droplet discharge method (an ink-jet method, a screen-printing method, an offset printing method, and the like), a doctor knife method, a roller coating method, a curtain coating machine, a knife coating method, or the like can be employed depending on the material. In addition, an inorganic material may be used, and in that case, silicon oxide, silicon nitride, silicon oxynitride, PSG (phosphosilicate glass), BPSG (borophosphosilicate glass), an alumina film, or the like can be used. Note that the first interlayer insulating film 533 may be formed by laminating these insulating films.

Furthermore, a second interlayer insulating film 534 is formed over the first interlayer insulating film 533 in this embodiment. A film having carbon such as DLC (diamond-like carbon), or carbon nitride (CN), or a silicon oxide film, a silicon nitride film, a silicon nitride oxide film, or the like can be used for the second interlayer insulating film 534. A plasma CVD method, an atmospheric pressure plasma method, or the like can be used for the manufacturing method. Alternatively, a photosensitive or non-photosensitive organic material such as polyimide, acrylic, polyamide, resist, or benzocyclobutene, or siloxane-based resin may be used.

Note that the stress is generated due to the difference in a thermal expansion coefficient between the first interlayer insulating film 533 or the second interlayer insulating film 534 and a conductive material or the like composing wirings 535 to 539 to be subsequently formed. A filler may be mixed in the first interlayer insulating film 533 or the second interlayer insulating film 534 depending on the stress in order to prevent the first interlayer insulating film 533 or the second interlayer insulating film 534 from being peeled or broken.

As shown in FIG. 4D, contact holes are formed in the first interlayer insulating film 533 and the second interlayer insulating film 534 to form the wirings 535 to 539 connected to the n-channel TFTs 529 and 531, and the p-channel TFT 530. A mixed gas of $CHF_3$ and He is used as the etching gas when the contact holes are opened; however, the etching gas is not limited thereto. The wirings 535 to 539 are formed from Al in this embodiment. Note that a five-layer structure in which Ti, TiN, Al—Si, Ti, and TiN are sequentially laminated may be employed to form the wirings 535 to 539 by using a sputtering method.

Note that the generation of a hillock in baking resist during patterning of the wirings can be prevented by mixing Si into Al. Alternatively, approximately 0.5% of Cu may be mixed instead of Si. In addition, hillock resistance is further enhanced by sandwiching an Al—Si layer with Ti or TiN. It is desirable to use the above hard mask made of silicon oxynitride or the like in patterning. Note that the material and the manufacturing method of the wirings are not limited thereto, and the material used for the above gate electrodes 510 to 512 may also be employed.

Note that the wirings 535 and 536 are connected to a high-concentration impurity region 527 of the n-channel TFT 529, the wirings 536 and 537 are connected to a high-concentration impurity region 519 of the p-channel TFT 530, and the wirings 538 and 539 are connected to a high concentration impurity region 528 of the n-channel TFT 531, respectively.

Figure 4E:
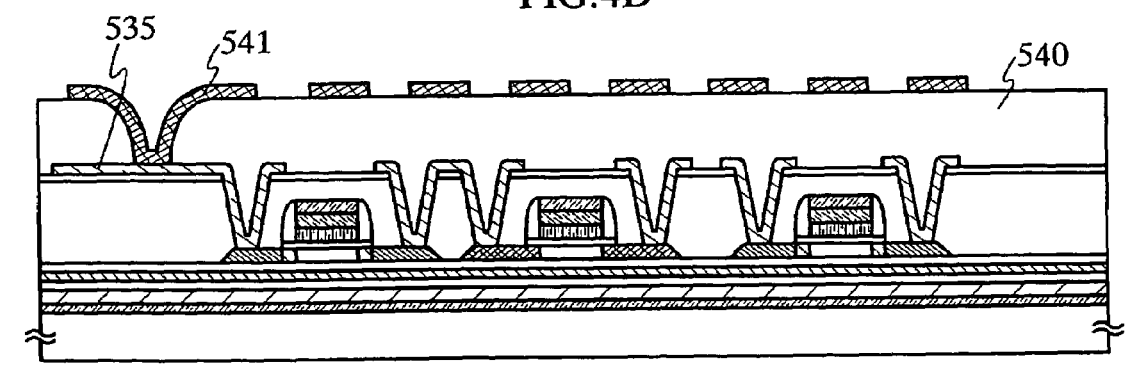

As shown in FIG. 4E, a third interlayer insulating film 540 is formed over the second interlayer insulating film 534 to cover the wirings 535 to 539. The third interlayer insulating film 540 has such an opening that part of the wiring 535 is exposed. In addition, the third interlayer insulating film 540 can be formed by using an organic resin film, an inorganic insulating film, or a siloxane-based insulating film. For example, acrylic, polyimide, polyamide, or the like can be used as the organic resin film, and silicon oxide, silicon nitride oxide, or the like can be used as the inorganic insulating film. Note that a mask used for forming the opening can be formed by a droplet discharge method or a printing method. Alternatively, the third interlayer insulating film 540 itself can also be formed by a droplet discharge method or a printing method.

An antenna 541 is formed over the third interlayer insulating film 540. A conductive material containing one or a plurality of metal and a metal compound of such as Ag, Au, Cu, Pd, Cr, Mo, Ti, Ta, W, Al, Fe, Co, Zn, Sn, and Ni can be used for the antenna 541. The antenna 541 is connected to the wiring 535. Note that the antenna 541 is directly connected to the wiring 535 in FIG. 4E; however, the structure of the ID chip employing the manufacturing method of the invention is not limited to this structure. For example, the antenna 541 and the wiring 535 may be electrically connected by using a wiring separately formed.

The antenna 541 can be formed by using a printing method, a photolithography method, an electroplating method, a vapor deposition method, a droplet discharge method, or the like. The antenna 541 is formed of a single layer conductive film in this embodiment; however, the antenna 541 can also be formed of a lamination of a plurality of conductive films.

It is possible to form the antenna 541 without using a mask for light-exposure by using a printing method or a droplet discharge method. In addition, the printing method and the droplet discharge method do not waste a material which is removed by etching in the photolithography method. Furthermore, since an expensive mask for light-exposure is not required to use, the cost spent on manufacturing an ID chip can be reduced.

When the droplet discharge method or various printing methods are used, for example, conductive particles or the like obtained by coating Cu with Ag can be used as well. Note that, when the antenna 541 is formed by using the droplet discharge method, it is desirable to perform treatment to the surface of the third interlayer insulating film 540 to enhance adhesion of the antenna 541.

Specifically, the following method can be given as an example of treatment to enhance the adhesion: a method for metal or a metal compound capable of enhancing the adhesion of a conductive film or an insulating film due to catalysis to the surface of the third interlayer insulating film 540; a method for attaching an organic-based insulating film, metal, or metal compound which has high adhesion with a conductive film or an insulating film to be formed to the surface of the third interlayer insulating film 540; a method for modifying the surface by performing plasma treatment to the surface of the third interlayer insulating film 540 under a atmospheric pressure or a reduce pressure; and the like. In addition, Sc, Ti, V, Cr, Mn, Fe, Co, Ni, Cu, Zn, or the like which is a 3d transition element besides titanium or titanium oxide can be given as an example of the metals having high adhesion with the above conductive film or insulating film. Furthermore, oxide, nitride, oxynitride, and the like of the above metal are given as an example of the metal compounds. For example, polyimide, siloxane-based resin, and the like are given as an example of the above organic-based insulating films.

When the metal or metal compound attached to the third interlayer insulating film 540 has conductivity, the sheet resistance is controlled so that the antenna 541 can operate normally. Specifically, the average thickness of the conductive metal or metal compound may be suppressed to be from 1 nm to 10 nm, for example, or the metal or metal compound may be partially or entirely insulated due to oxidation. Alternatively, the attached metal or metal compound may be selectively removed by etching except for a region where high adhesion is required. The metal or metal compound may be selectively attached only to a specific region by using the droplet discharge method, the printing method, a sol-gel method, or the like instead of attaching it to the entire surface of the substrate in advance. Note that the metal or metal compound is not required to be in a state of a completely continuous film on the surface of the third interlayer insulating film 540 and it may be in a dispersed state to some extent.

Figure 5A:
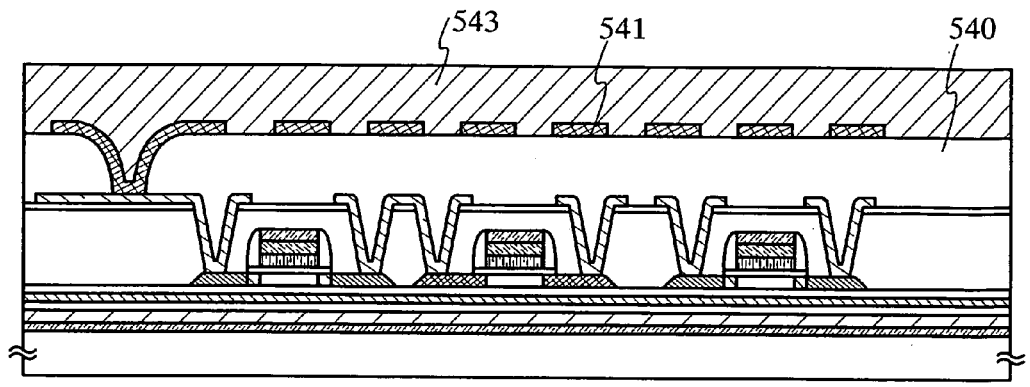
FIGS. 5A to 5C are cross-sectional views showing a method for manufacturing a semiconductor device according to certain aspects of the present invention.

As shown in FIG. 5A, a protective layer 543 is formed over the third interlayer insulating film 540 to cover the antenna 541. The protective layer 543 is formed by using a material capable of protecting the n-channel TFTs 529 and 531, the p-channel TFT 530, and the wirings 535 to 539 when the peeling layer 502 is subsequently removed by etching. For example, the protective layer 543 can be formed by coating epoxy-based, acrylate-based, or silicon-based resin soluble in water or alcohols over the entire surface.

In this embodiment, water-soluble resin (VL-WSHL10 manufactured by Toagosei Co., Ltd.) is coated by a spin coating method to have a 30 μm film thickness and light-exposure is performed for 2 minutes to perform temporary curing. Thereafter, its back side is exposed to UV rays for 2.5 minutes and its surface side is exposed for 10 minutes, which takes a total exposure time of 12.5 minutes to be fully cured. Consequently, the protective layer 543 is formed. In the case of laminating a plurality of organic resins, there is a fear that part of the organic resins is dissolved or the adhesion becomes too high during coating or baking depending on the solvents used among the organic resins. Therefore, in the case of using organic resins soluble in the same solvent for the third interlayer insulating film 540 and the protective layer 543, an inorganic insulating film (a silicon nitride film, a silicon nitride oxide film, an $AlN_X$ film, or an $AlN_XO_Y$ film) is preferably formed to cover the third interlayer insulating film 540 so that the protective layer 543 is removed smoothly in the subsequent step.

Figure 5B:
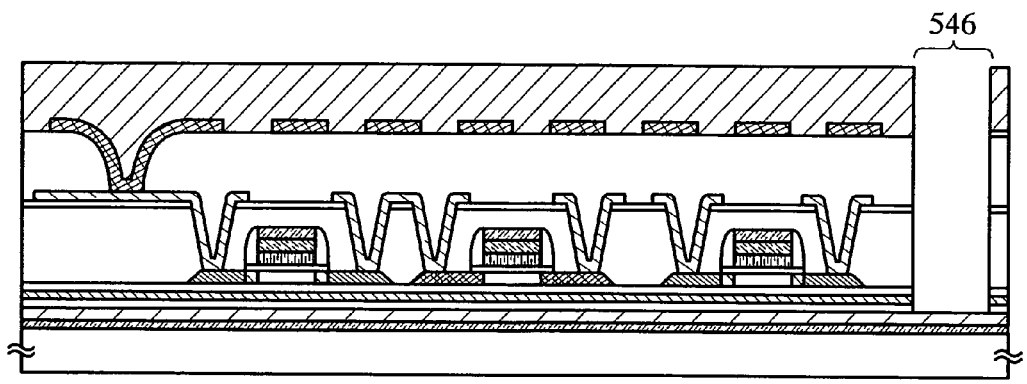

As shown in FIG. 5B, a groove 546 is formed in order to isolate from the ID chips respectively. It is preferable that the groove 546 has enough depth that the peeling layer 502 is exposed. A dicing method, a scribing method, a photolithography method, or the like can be used to form the groove 546. Note that the groove 546 is not necessarily formed when the ID chips formed over the first substrate 500 are not required to be isolated.

Figure 5C:
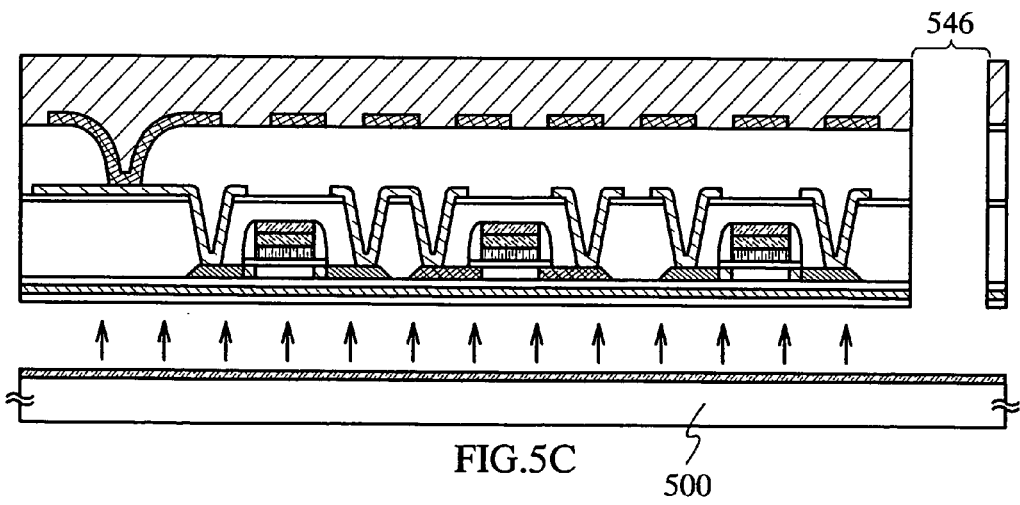

As shown in FIG. 5C, the peeling layer 502 is removed by etching. In this embodiment, fluorine halide is used as an etching gas and the gas is flown from the groove 546. In this embodiment, for example, etching is performed by using $ClF_3$ (chlorine trifluoride) under a condition in which temperature is 350° C., a flow rate is 300 sccm, a pressure is 799.8 Pa, and time is 3 hours. Alternatively, a $ClF_3$ gas mixed with nitrogen may be used. The peeling layer 502 is selectively etched by using halogen fluoride such as $ClF_3$, and the first substrate 500 can be peeled from the n-channel TFTs 529 and 531, and the p-channel TFT 530. Note that the halogen fluoride may be either gas or liquid.

Figure 6A:
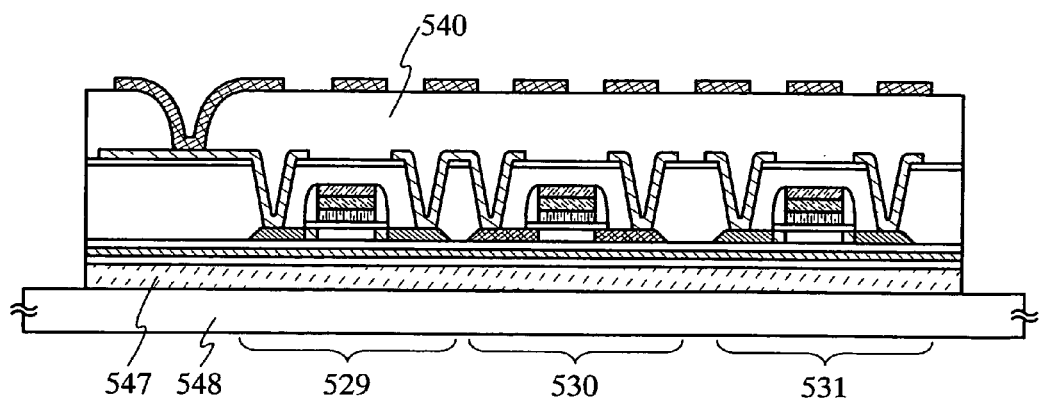
FIGS. 6A and 6B are cross-sectional views showing a method for manufacturing a semiconductor device according to certain aspects of the present invention.

As shown in FIG. 6A, the peeled n-channel TFTs 529 and 531, and the p-channel TFT 530 are attached to a second substrate 548 by using an adhesive 547 to remove the protective layer 543. A material that can attach the second substrate 548 and the base film 503 is used for the adhesive 547. Various curable adhesives, for example, a photo-curing adhesive such as a reactive curing adhesive, a thermosetting adhesive, and an UV curable adhesive; an anaerobic adhesive; and the like can be used for the adhesive 547.

For example, a glass substrate such as a barium borosilicate glass or an alumino borosilicate glass, an organic material such as paper or plastics having flexibility can be used as the second substrate 548. Alternatively, a flexible inorganic material may also be used for the second substrate 548. ARTON made of polynorbornene having a polar group (manufactured by JSR) can be used for the plastic substrate. Besides, the plastic substrate made of the following can be given as an example: polyester typified by polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, acrylonitrile butadiene styrene resin, polyvinyl chloride, polypropylene, polyvinyl acetate, acrylic resin, and the like. It is desirable that the second substrate 548 has high thermal conductivity ranging approximately from 2 W/mK to 30 W/mK in order to diffuse heat generated in the integrated circuit.

Figure 6B:
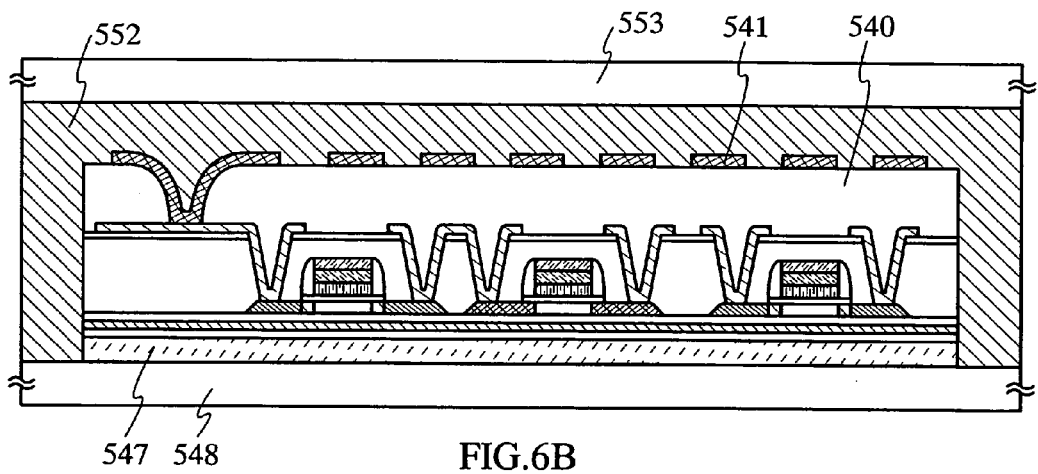

As shown in FIG. 6B, an adhesive 552 is coated over the antenna 541 and the third interlayer insulating film 540 to attach a cover member 553. The same material as that of the second substrate 548 can be used for the cover member 553. The thickness of the adhesive 552 preferably ranges from 10 μm to 200 μm, for example.

In addition, a material that can attach the cover member 553, the antenna 541, and the third interlayer insulating film 540 is used for the adhesive 552. Various curable adhesives, for example, a photo-curing adhesive such as a reactive curing adhesive, a thermosetting adhesive, and an UV curable adhesive; an anaerobic adhesive; and the like can be used for the adhesive 522.

Note that the cover member 553 is attached to the antenna 541 and the third interlayer insulating film 540 by using the adhesive 552 in this embodiment; however, the invention is not limited thereto, and the cover member 553 is not necessarily used for the ID chip. For example, the mechanical strength of the ID chip may be enhanced by covering the antenna 541 and the third interlayer insulating film 540 with resin or the like. Alternatively, the steps may be finished up to that shown in FIG. 6A without using the cover member 553.

Through the steps mentioned above, the ID is completed. According to the above manufacturing method, an extremely thin integrated circuit with a total film thickness ranging from 0.3 μm or more to 3 μm or less, typically approximately 2 μm can be formed between the second substrate 548 and the cover member 553. Note that the thickness of the integrated circuit includes a thickness of various insulating films and interlayer insulating films formed between the adhesives 547 and 552 besides a thickness of the semiconductor element itself; however, the thickness of the antenna is not included. In addition, the integrated circuit included in the ID chip can be formed so as to occupy an area of approximately 5 mm square (25 mm$^2$) or less, more desirably approximately from 0.3 mm square (0.09 mm$^2$) to 4 mm square (16 mm$^2$).

Note that the mechanical strength of the ID chip can be enhanced by disposing the integrated circuit at a position close to the center between the second substrate 548 and the cover member 553. Specifically, when a distance between the second substrate 548 and the cover member 553 is taken as "d", it is desirable that the thickness of the adhesive 547 and the adhesive 552 is controlled so that a distance "x" between the center in the direction of the thickness of the integrated circuit and the second substrate 548 satisfies the following formula shown in Formula 1.

$$\frac{1}{2}d - 30 \ \mu m < x < \frac{1}{2}d + 30 \ \mu m \qquad \text{[Formula 1]}$$

In addition, preferably, the thickness of the adhesives 547 and 552 is reduced so that the distance "x" satisfies the following formula shown in Formula 2.

$$\frac{1}{2}d - 10 \ \mu m < x < \frac{1}{2}d + 10 \ \mu m \qquad \text{[Formula 2]}$$

Figure 7:
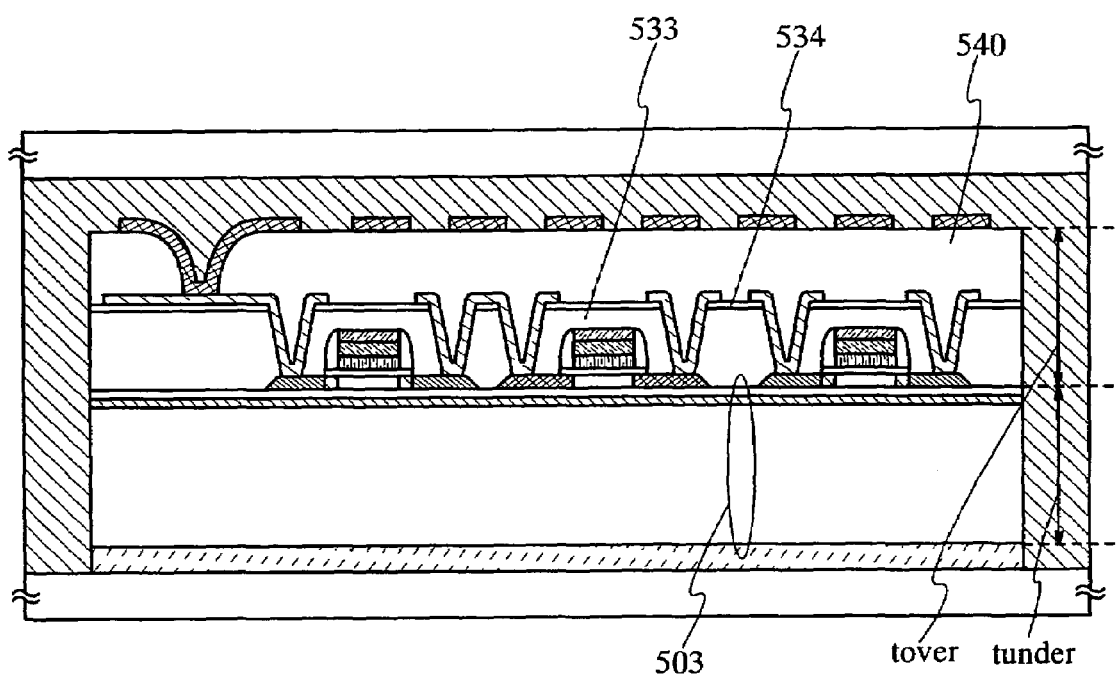
FIG. 7 is a cross-sectional view of a semiconductor device according to a certain aspect of the present invention.

As shown in FIG. 7, the thickness of the base film 503, the first interlayer insulating film 533, the second interlayer insulating film 534, or the third interlayer insulating film 540 may be adjusted so that a distance between a distance from the island-shape semiconductor films 505 to 507 of TFTs in an integrated circuit to the lower part of the base film 503 ($t_{under}$) and a distance from the island-shape semiconductor films 505 to 507 to the upper part of the third interlayer insulating film 540 ($t_{over}$) is the same or almost similar. Accordingly, the stress on a semiconductor film can be relieved, and thus, generation of crack can be prevented by disposing the island-shape semiconductor films 505 to 507 at the center of the integrated circuit.

In the case of using organic resin for the adhesive 547 being in contact with the base film 503 in order to ensure flexibility of the ID chip, alkali metal such as Na or alkaline earth metal can be prevented from diffusing into the island-shape semiconductor films 505 to 507 from the organic resin by using a silicon nitride film or a silicon nitride oxide film for the base film 503.

When the surface of an object has a curved surface, and thus, the second substrate 548 of the ID chip attached to the curved surface is curved to have a curved surface along a generating line such as a conical surface or a cylindrical surface, it is desirable that the direction of the generating line be identical with the moving direction of carriers of the n-channel TFTs 529 and 531, and the p-channel TFT 530. According to the above structure, even when the second substrate 548 is curved, an adverse effect on characteristics of the n-channel TFTs 529 and 531, and the p-channel TFT 530 due to it can be suppressed. In addition, the rate of the area occupied by the island-shape semiconductor films 505 to 507 in the integrated circuit can be from 1% to 30%; therefore, even the second substrate 548 is curved, an adverse effect on characteristics of the n-channel TFTs 529 and 531, and the p-channel TFT 530 due to it can be suppressed.

Note that a repetition rate of a radio wave generally used for an ID chip is often 13.56 MHz or 2.45 GHz, and it is extremely significant in enhancing versatility to form an ID chip so that a radio with the repetition rate can be detected.

In addition, the ID chip shown in this embodiment has merit that the radio wave is unlikely to be shielded and a signal can be prevented from diminishing due to the shielding of the radio wave compared with an ID chip formed by using a semiconductor substrate. Thus, since a semiconductor substrate is not necessary, the cost of the ID chip can be reduced considerably. For example, the case of using a semiconductor substrate with a 12-inches diameter and the case of using a glass substrate in a size of 730×920 mm$^2$ are compared. The area of the former semiconductor substrate is approximately 73,000 mm$^2$. The area of the latter glass substrate is approximately 672,000 mm$^2$, which corresponds to approximately 9.2 times larger than that of the semiconductor substrate. When the area wasted by segmenting the glass substrate with the area of approximately 672,000 mm$^2$ is disregarded, it can be calculated that approximately 672,000 ID chips in a size of 1 mm$^2$ can be formed. This number corresponds to approximately 9.2 times larger than that of the semiconductor substrate. In addition, since fewer steps are required when the glass substrate in a size of 730×920 mm$^2$ is used than when the semiconductor substrate with a 12-inches diameter is used, the amount of facility investment for the mass production of an ID chip can be reduced up to one-third. Furthermore, according to the invention, the glass substrate can be recycled after peeling the integrate circuit. Thus, the cost can be reduced considerably compared with the case of using the semiconductor substrate even when the expense to make up for a broken glass substrate or the expense to clean the surface of the glass substrate is considered. Even when the glass substrate is discarded without recycling, the cost of the glass substrate in a size of 730×920 mm$^2$ can be approximately half the size than that of the semiconductor substrate with a 12-inches diameter; therefore, it can be recognized that the cost of the ID chip can be reduced considerably.

Therefore, it is recognized that the price of the ID chip can be reduced to approximately a one-30$^{th}$ when the glass substrate in a size of 730×920 mm² is used than the semiconductor substrate with a 12-inches diameter is used. Since the application of an ID chip based on throwaway is also expected, the ID chip employing the manufacturing method of the invention capable of reducing the cost considerably is extremely effective for the above application.

[Embodiment 2]

This embodiment describes an optical micrograph of the sample in which a peeling layer is etched after crystallizing it by performing laser crystallization of a semiconductor film with a continuous-wave laser.

The sample used in this embodiment is formed by sequentially laminating a buffer film, a peeling layer, a base film, and a semiconductor film over a glass substrate; then crystallizing the semiconductor film by using a catalyst element; further the semiconductor film is partially crystallized with a continuous-wave laser; and then the crystallized semiconductor film is removed by etching. Then, a groove is formed by scribing, and thus, the peeling layer is exposed and etched partially.

Specifically, the buffer film made of 100 nm thick silicon oxynitride is formed over a glass substrate by using a sputtering method, and the peeling layer made of 50 nm amorphous silicon is formed over the buffer film by using a plasma CVD method to form each sample. In addition, the base film sequentially laminated with an insulating film made of silicon oxynitride, an insulating film made of silicon nitride oxide, and an insulating film made of silicon oxynitride is formed over the peeling layer. All of each insulating film mentioned above is formed by using a plasma CVD method, each thickness is sequentially 100 nm, 50 nm, and 100 nm. Moreover, the semiconductor film made of amorphous silicon is formed over the base film by using a plasma CVD method.

$ClF_3$ diluted with $N_2$ is used as an etching gas, and the etching gas is flown from a groove. The flow rate of $ClF_3$ is set to be 100 sccm; the partial pressure, 799.8 Pa; the flow rate of $N_2$, 250 sccm; the partial pressure, 226.6 Pa, and a temperature condition during etching is set to be at 100° C. for 0.5 hour.

Figure 9:
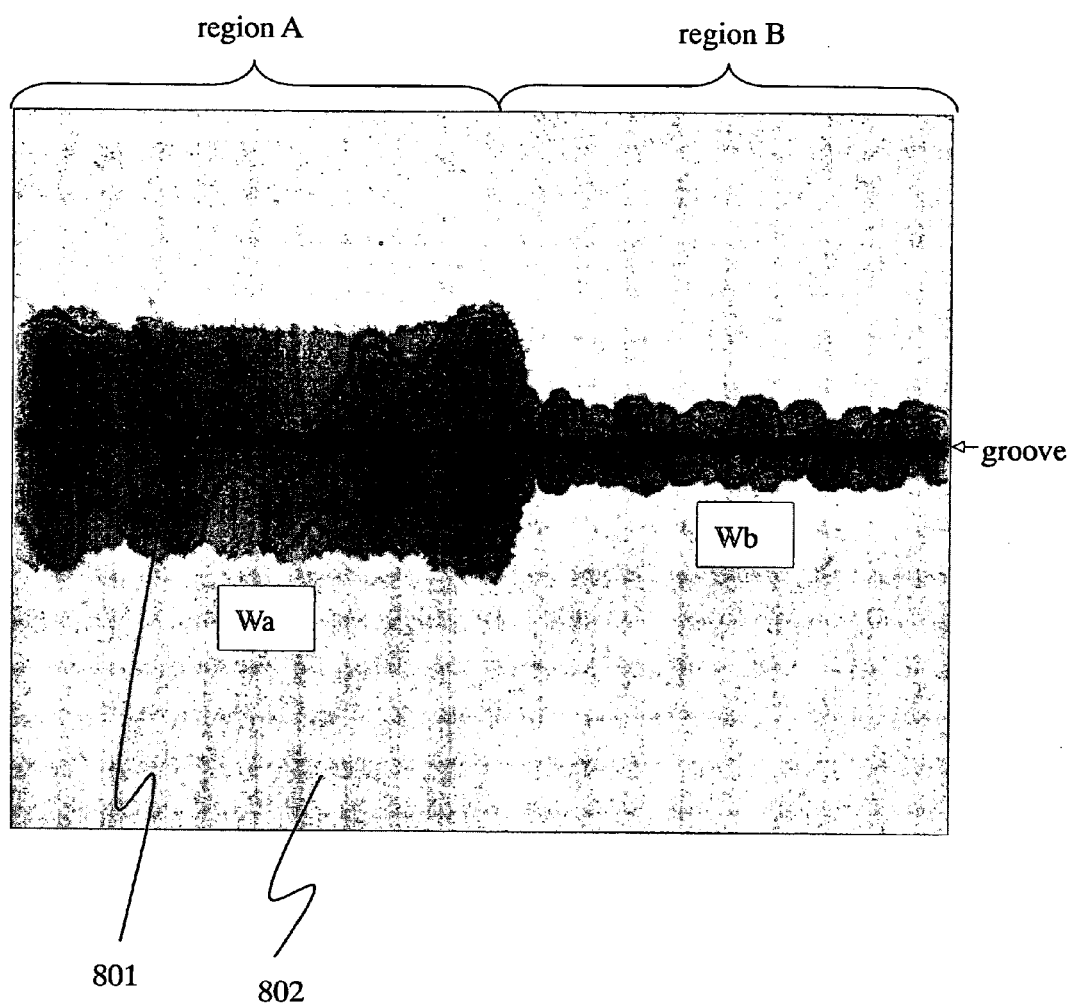
FIG. 9 is an optical micrograph after etching.
Figure 10:
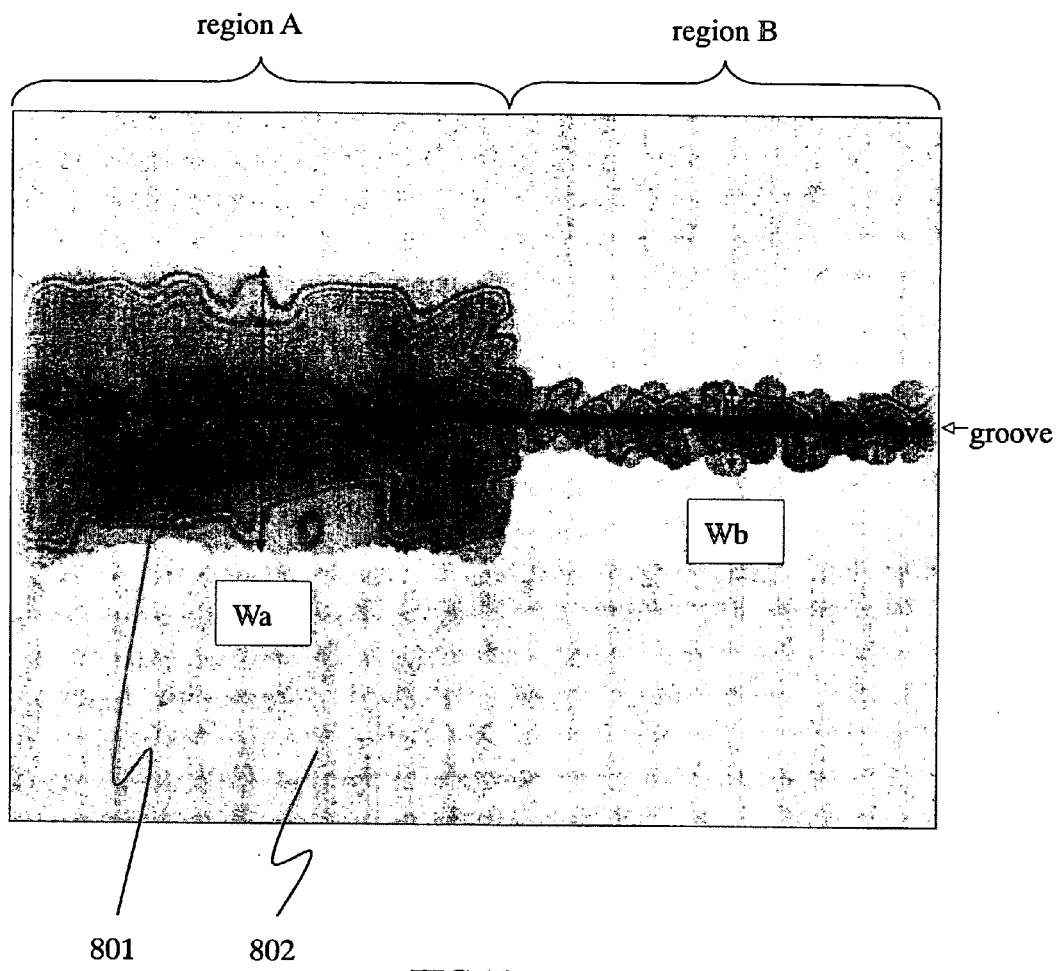
FIG. 10 is an optical micrograph after etching.
Figure 11:
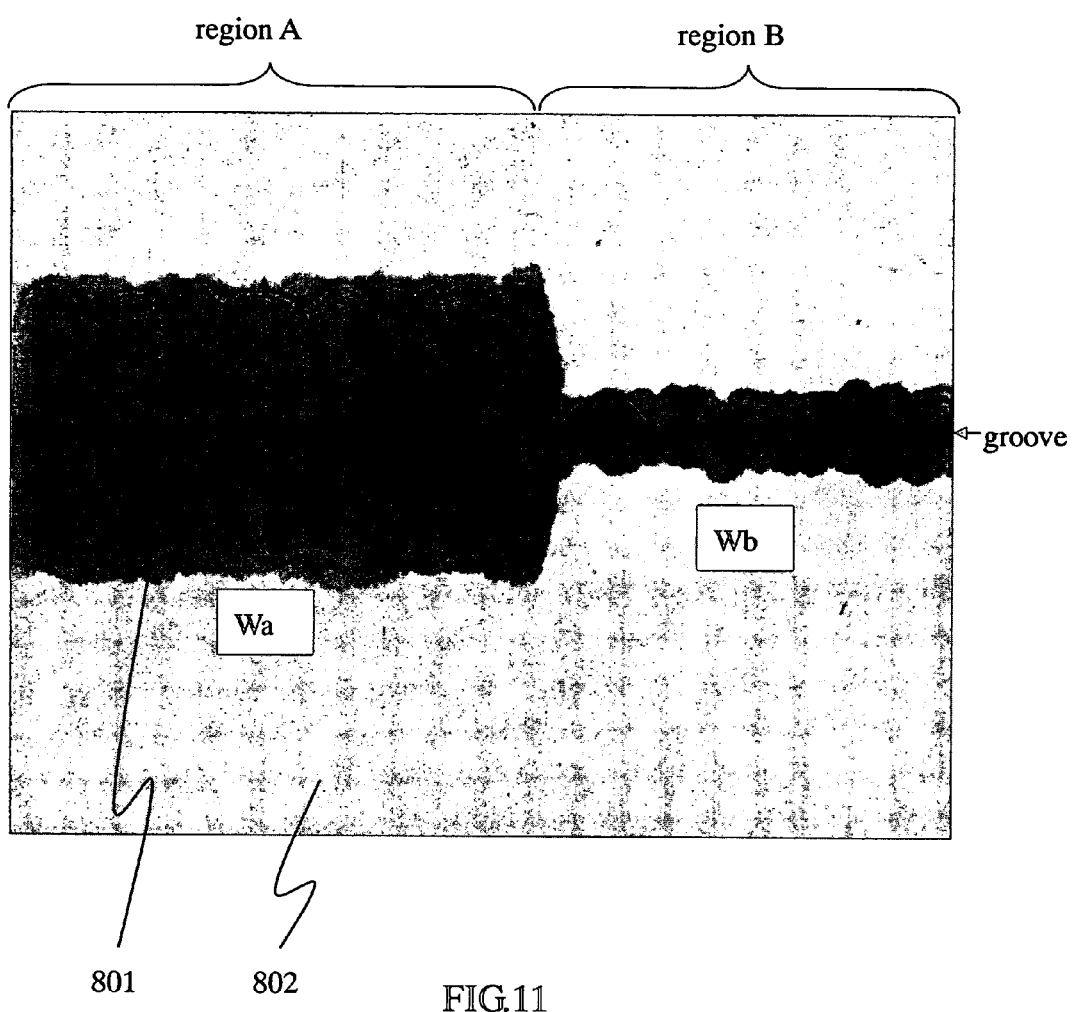
FIG. 11 is an optical micrograph after etching.

FIG. 9 to FIG. 11 show an optical micrograph of each sample after partially etching the peeling layer. The magnification of the micrograph is 200 times, and FIG. 9 corresponds to a 66 nm thick sample of the semiconductor film; FIG. 10, a 100 nm thick sample of the semiconductor film; and FIG. 11, a 150 nm thick sample of the semiconductor film. A continuous-wave Nd: $YVO_4$ laser is used for laser crystallization of the semiconductor film, and the laser light is set to be a second harmonic (532 nm), a scanning speed of 35 cm/sec, and a beam spot in a size of 400 μm in a major axis and from 10 μm to 20 μm in a minor axis. In addition, with respect to the energy of laser light, the sample shown in FIG. 9 is set to be 5.0 W; FIG. 10, 6.1 W; and FIG. 11, 6.1 W.

In FIG. 9 to FIG. 11, a region A corresponds to a region irradiated with continuous-wave laser light, and a region B corresponds to a region not irradiated with the laser light. A stretch of a groove is formed in a horizontal direction of the micrograph, and a black part extended from the groove corresponds to a region 801 where the peeling layer is peeled by etching, and the other regions correspond to a region 802 where the peeling layer is not peeled.

In the micrographs shown in FIG. 9 to FIG. 11, the width of the direction vertical to the groove of the region 801 where the peeling layer is peeled in the region A is taken as "Wa", and the width of the direction vertical to the groove of the region 801 where the peeling layer is peeled in the region B is taken as "Wb". In the case of FIG. 9, Wa/Wb is approximately 2.29; FIG. 10, 3.36; and FIG. 11, 3.36. Thus, according to FIG. 9 to FIG. 11, it can be recognized that the region 801 where the peeling layer is peeled is wider in the region A than the region B in all samples. Therefore, it can be recognized that the peeling layer in the lower layer is crystallized by the crystallization of the semiconductor film, and thus, the etching rate is enhanced.

[Embodiment 3]

Figure 12A:
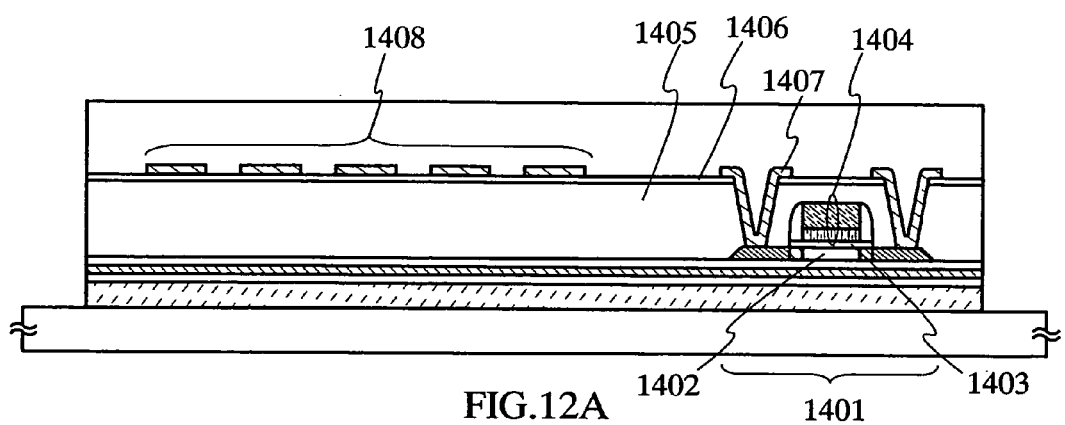
FIGS. 12A and 12B are cross-sectional views of a semiconductor device employing a manufacturing method according to certain aspects of the present invention.

A structure of an ID chip in the case of forming a wiring and an antenna connected to a TFT concurrently by patterning a conductive film is described with reference to FIG. 12A. FIG. 12A shows a cross-sectional view of the ID chip in this embodiment.

In FIG. 12A, a TFT 1401 includes an island-shape semiconductor film 1402, a gate insulating film 1403 being in contact with the island-shape semiconductor film 1402, and a gate electrode 1404 overlapped with the island-shape semiconductor film 1402 by sandwiching the gate insulating film 1403 therebetween. In addition, the TFT 1401 is covered with a first interlayer insulating film 1405 and a second interlayer insulating film 1406. Note that the TFT 1401 is covered with the two interlayer insulating films of the first interlayer insulating film 1405 and the second interlayer insulating film 1406 in this embodiment; however, this embodiment is not limited to this structure. The TFT 1401 may be covered with a single layer of an interlayer insulating film, or, may be covered with interlayer insulating films laminated with three or more layers.

A wiring 1407 formed over the second interlayer insulating film 1406 is connected to the island-shape semiconductor film 1402 through contact holes formed in the first interlayer insulating film 1405 and the second interlayer insulating film 1406.

In addition, an antenna 1408 is formed over the second interlayer insulating film 1406. The wiring 1407 and the antenna 1408 can be formed concurrently by forming a conductive film over the second interlayer insulating film 1406 and patterning the conductive film. The number of the step of manufacturing the ID chip can be reduced by forming the antenna 1408 and the wiring 1407 concurrently.

Figure 12B:
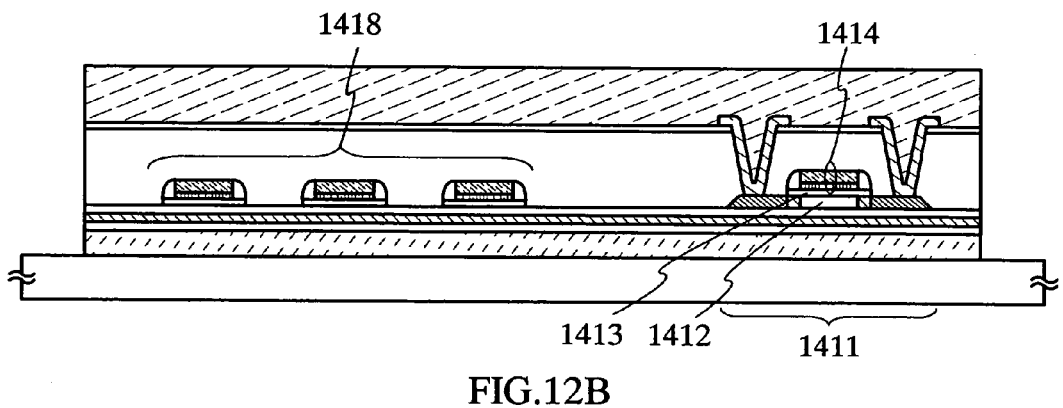

Next, a structure of an ID chip in the case of forming a gate electrode of a TFT and an antenna concurrently by patterning a conductive film is described with reference to FIG. 12B. FIG. 12B shows a cross-sectional view of the ID chip in this embodiment.

In FIG. 12B, a TFT 1411 includes an island-shape semiconductor film 1412, a gate insulating film 1413 overlapped with the island-shape semiconductor film 1412, and a gate electrode 1414 overlapped with the island-shape semiconductor film 1412 by sandwiching the gate insulating film 1403 therebetween. In addition, an antenna 1418 is formed over the gate insulating film 1413. The gate electrode 1414 and the antenna 1418 can be formed concurrently by forming a conductive film over the gate insulating film 1413 and patterning the conductive film. The number of the step of manufacturing the ID chip can be reduced by forming the antenna 1418 and the gate electrode 1414 concurrently.

[Embodiment 4]

This embodiment describes a structure of an ID chip in which an antenna and an integrated circuit that are formed over different substrates are electrically connected to each other.

Figure 13:
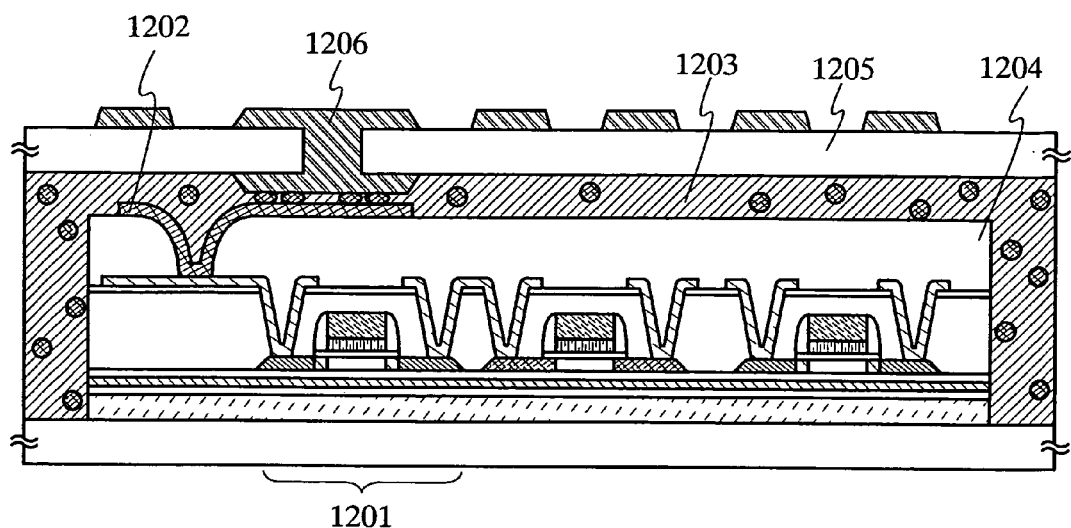
FIG. 13 is a cross-sectional view of a semiconductor device employing a manufacturing method according to a certain aspect of the present invention.

FIG. 13 shows a cross-sectional view of the ID chip in this embodiment. In FIG. 13, an adhesive 1203 is coated over a third interlayer insulating film 1204 to cover a wiring 1202 electrically connected to a TFT 1201. Then, a cover member 1205 is attached to the third interlayer insulating film 1204 by the adhesive 1203.

An antenna 1206 is formed in the cover member 1205 in advance. In this embodiment, the antenna 1206 is electrically connected to the wiring 1202 by using anisotropic conductive resin for the adhesive 1203.

The anisotropic conductive resin is a material in which a conductive material is dispersed in resin. For example, thermosetting resin such as epoxy-based, urethane-based, and acrylic-based resin; thermoplastic resin such as polyethylene-based and polypropylene-based resin; siloxane-based resin; or the like can be used for the resin. In addition, for example, plastic particles such as polystyrene, epoxy, and the like coated with Ni, Au, or the like; metal particles such as Ni, Au, Ag, solder; particulate or fibrous carbon; fibrous Ni coated with Au; or the like can be used for the conductive material. It is desirable to decide the size of the conductive material according to the pitch between the antenna 1206 and the wiring 1202.

Alternatively, the antenna 1206 and the wiring 1202 may be pressed to attach to each other by applying ultrasonic waves to the anisotropic conductive resin or pressed to attach to each other by curing the anisotropic conductive resin due to irradiation of ultraviolet light.

Note that this embodiment shows an example of electrically connecting the antenna 1206 to the wiring 1202 with the adhesive 1203 made of the anisotropic conductive resin. However, the present invention is not limited to this structure. An anisotropic conductive film may be used instead of the adhesive 1203 to electrically connect the antenna 1206 to the wiring 1202 by pressing the anisotropic conductive film.

[Embodiment 5]

This embodiment describes a structure of an ID chip manufactured by employing a manufacturing method according to the present invention.

Figure 14A:
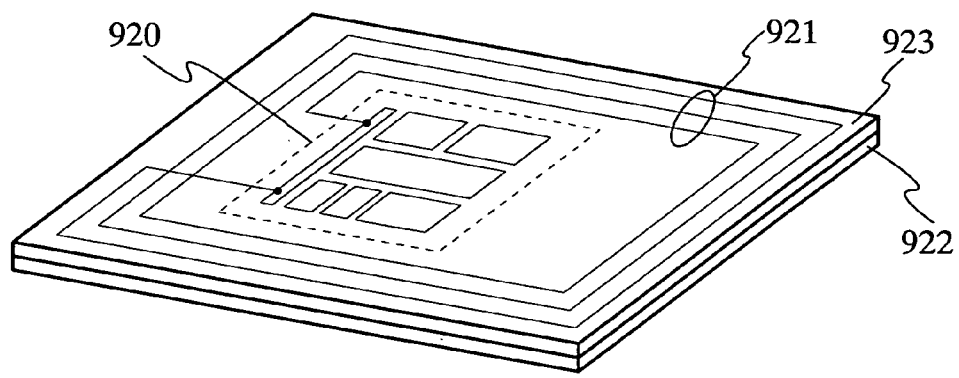
FIGS. 14A and 14B show a structure of an ID chip employing a manufacturing method according to certain aspects of the present invention.

FIG. 14A is a perspective view showing one mode of the ID chip. Reference numeral 920 denotes an integrated circuit; and 921, an antenna, and the antenna 921 is electrically connected to the integrated circuit 920. Reference numeral 922 denotes a substrate; 923, a cover member, and the integrated circuit 920 and the antenna 921 are sandwiched between the substrate 922 and the cover member 923.

Figure 14B:
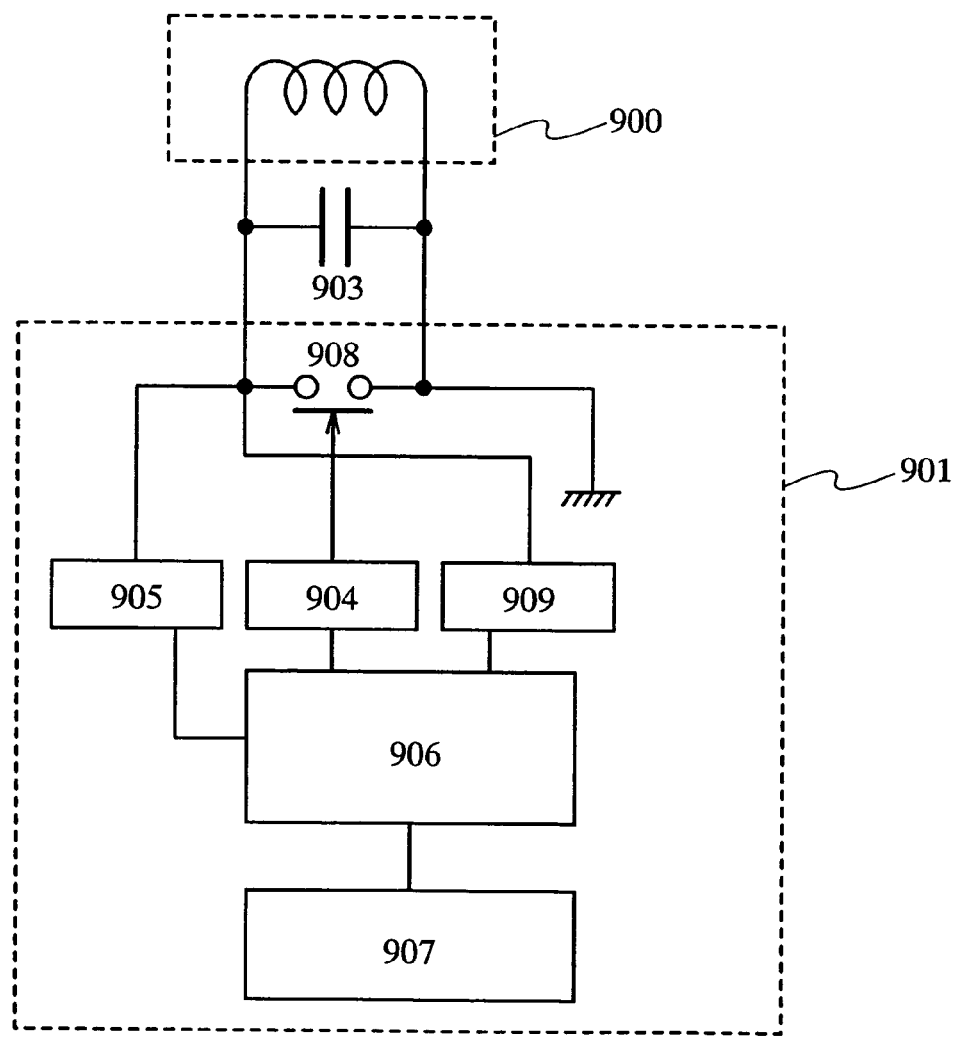

Next, FIG. 14B is a block diagram showing one mode of a functional structure of the ID chip shown in FIG. 14A.

In FIG. 14B, reference numeral 900 denotes an antenna; and 901, an integrated circuit. In addition, reference numeral 903 denotes a capacitor formed between the both terminals of the antenna 900. The integrated circuit 901 includes a demodulation circuit 909, a modulation circuit 904, a rectification circuit 905, a microprocessor 906, a memory 907, and a switch 908 for applying load modulation to the antenna 900. Note that a plurality of memories may be employed instead of using one memory 907, and memories such as SRAMs, flash memories, and ROMs, or FRAMs (registered trademark) can be used.

Signals transmitted from a reader/writer as radio waves are modulated into an alternating-current electrical signals in the antenna 900 by electromagnetic induction. The alternating-current electrical signals are demodulated in the demodulation circuit 909 and the demodulated signals are transmitted to the subsequent stage, the microprocessor 906. In addition, a power supply voltage is generated in the rectification circuit 905 by using the alternating-current electrical signals to supply the subsequent stage, the microprocessor 906. Various arithmetic processing is performed in the microprocessor 906 according to the input signals. Programs, data, and the like used in the microprocessor 906 is stored in the memory 907, besides, the memory 907 can also be used as a working space during arithmetic processing.

When data is transmitted to the modulation circuit 904 from the microprocessor 906, the modulation circuit 904 controls the switch 908 and load modulation can be applied to the antenna 900 according to the data. The reader/writer receives load modulation applied to the antenna 900 by radio waves so that it can read the data from the microprocessor 906 as a result.

Note that the ID chip is not required to have the microprocessor 906. In addition, the signal transmission type is not limited to the electromagnetic induction type as shown in FIG. 14B, and other transmission type such as an electromagnetic coupling type, or a microwave type may also be used.

[Embodiment 6]

This embodiment describes a TFT structure of a semiconductor device manufactured by employing a manufacturing method of the present invention.

Figure 15A:
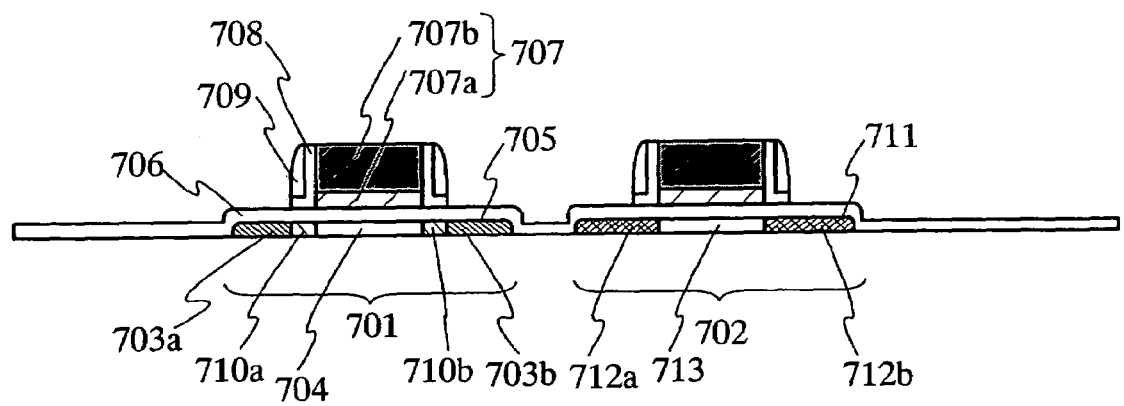
FIGS. 15A to 15C are embodiments of a TFT included in a semiconductor device, employing a manufacturing method according to certain aspects of the present invention.

FIG. 15A is a cross-sectional view showing the TFT in this embodiment. Reference numeral 701 denotes an n-channel TFT; and 702, a p-channel TFT. The n-channel TFl 701 is given as an example to describe a structure more detailed.

The n-channel TFT 701 has an island-shape semiconductor film 705 which is used as an active layer. The island-shape semiconductor film 705 includes impurity regions 703*a* and 703*b* used as a source region or a drain region, a channel formation region 704 sandwiched between the impurity regions 703*a* and 703*b*, and LDD (Light Doped Drain) regions 710*a* and 710*b* sandwiched between the impurity regions 703*a* and 703*b*, and the channel formation region 704. In addition, the n-channel TFF 701 includes a gate insulating film 706 covering the island-shape semiconductor film 705, a gate electrode 707, and two sidewalls 708 and 709 formed of an insulating film.

Note that the gate electrode 707 has two layers of conductive films 707*a* and 707*b* in this embodiment; however, the invention is not limited to this structure. The gate electrode 707 may be formed of one layer of a conductive film or may be formed of two or more layers of a conductive film. The gate electrode 707 is overlapped with the channel formation region 704 included in the island-shape semiconductor film 705 by sandwiching the gate insulating film 706 therebetween. In addition, the sidewalls 708 and 709 are overlapped with two LDD regions 710*a* and 710*b* included in the island-shape semiconductor film 705 by sandwiching the gate insulating film 706 therebetween.

For example, the sidewall 708 can be formed by etching a 100 nm thick silicon oxide film and the sidewall 709 can be formed by etching a 200 nm thick LTO (Low Temperature Oxide) film. In this embodiment, a silicon oxide film used for the sidewall 708 is formed by a plasma CVD method, and a LTO film used for the sidewall 709 is formed by a low-pressure CVD method. Note that nitrogen may be mixed in the silicon oxide film; however, the number of the nitrogen atom is made fewer than the number of the oxygen atom.

N-type impurities are doped into the island-shape semiconductor film 705 by using the gate electrode 707 as a mask. Then, the sidewalls 708 and 709 are formed and n-type impurities are doped into the island-shape semiconductor film 705 by using the sidewalls 708 and 709 as masks; therefore, the impurity regions 703 and the LDD regions 710 can be separately formed.

Note that the p-channel TFT 702 has substantially the same structure as that of the n-channel TFT 701, except for the structure of an island-shape semiconductor film 711 included in the p-channel TFF 702. The island-shape semiconductor film 711 does not have a LDD region but have impurity regions 712*a* and 712*b* and a channel formation region 713 sandwiched between the impurity regions 712*a* and 712*b*. Then, p-type impurities are doped into the impurity regions 712. Note that FIG. 15A shows an example of the p-channel TFT 702 without a LDD region; however, the invention is not limited to this structure. The p-channel TFT 702 may have a LDD region.

Figure 15B:
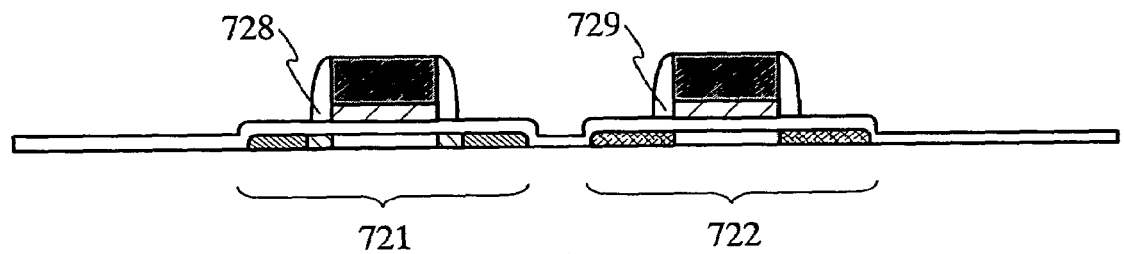

FIG. 15B shows the case of one sidewall in the TFT shown in FIG. 15A. Each of an n-channel TFT 721 and a p-channel TFT 722 shown in FIG. 15B has one sidewall 728 or 729, respectively. For example, the sidewalls 728 and 729 can be formed by etching a 100 nm thick silicon oxide film. In this embodiment, a silicon oxide film used for the sidewall 728 is formed by a plasma CVD method. Note that nitrogen may be mixed in the silicon oxide film; however, the number of the nitrogen atom is made fewer than the number of the oxygen atom.

Figure 15C:
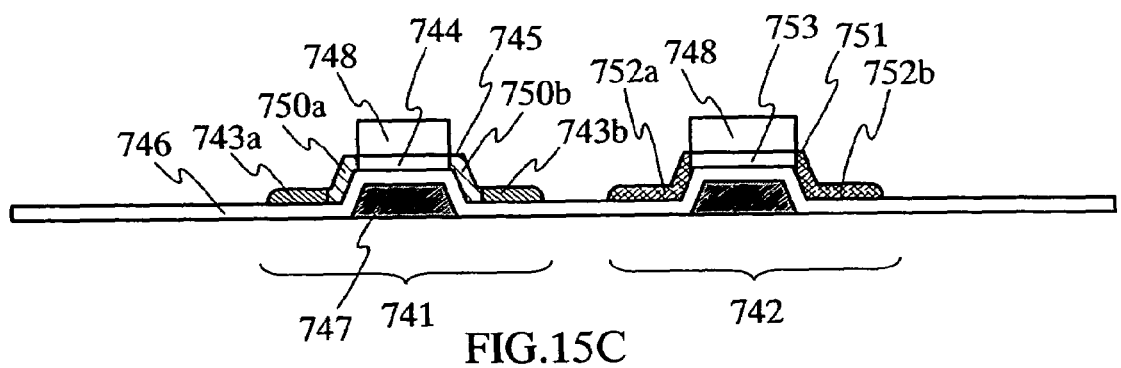

FIG. 15C shows a structure of a bottom gate TFT. Reference numeral 741 denotes an n-channel TFT; and 742, a p-channel TFT. The n-channel TFT 741 is given as an example to describe a structure more detailed.

In FIG. 15C, the n-channel TFT 741 has an island-shape semiconductor film 745. The island-shape semiconductor film 745 includes impurity regions 743*a* and 743*b* used as a source region or a drain region, a channel formation region 744 sandwiched between the impurity regions 743*a* and 743*b*, and LDD (Light Doped Drain) regions 750*a* and 750*b* sandwiched between the impurity regions 743*a* and 743*b*, and the channel formation region 744. In addition, the n-channel TFT 741 includes a gate insulating film 746, a gate electrode 747, and a channel protective film 748 formed of an insulating film.

The gate electrode 747 is overlapped with the channel formation region 744 included in the island-shape semiconductor film 745 by sandwiching the gate insulating film 746 therebetween. The gate insulating film 746 is formed after the gate electrode 747 is formed, and the island-shape semiconductor film 745 is formed after the gate insulating film 746 is formed. In addition, the channel protective film 748 is overlapped with the gate insulating film 746 by sandwiching the channel formation region 744 therebetween.

For example, the channel protective film 748 can be formed by etching a 100 nm thick silicon oxide film. In this embodiment, a silicon oxide film used for the channel protective film 748 is formed by a plasma CVD method. Note that nitrogen may be mixed in the silicon oxide film; however, the number of the nitrogen atom is made fewer than the number of the oxygen atom.

N-type impurities are doped into the island-shape semiconductor film 745 by using a resist mask. Then, the channel protective film 748 is formed and n-type impurities are doped into the island-shape semiconductor film 745 by using the channel protective film 748 as a mask; therefore, the impurity regions 743 and the LDD regions 750 can be separately formed.

Note that the p-channel TFT 742 has substantially the same structure as that of the n-channel TFT 741, except for the structure of an island-shape semiconductor film 751 included in the p-channel TFT 742. The island-shape semiconductor film 751 does not have a LDD region but have two impurity regions 752 and a channel formation region 753 sandwiched between the impurity regions 752. Then, p-type impurities are doped into the impurity regions 752. Note that FIG. 15C show an example of the p-channel TFT 742 without a LDD region; however, the invention is not limited to this structure. The p-channel TFT 742 may have a LDD region, and the n-channel TFT 741 may not have a LDD region.

[Embodiment 7]

This embodiment describes a method for manufacturing a plurality of semiconductor devices by using a large-sized substrate. Note that this embodiment is described by giving an ID chip which is one of the semiconductor devices as an example.

Figure 16A:
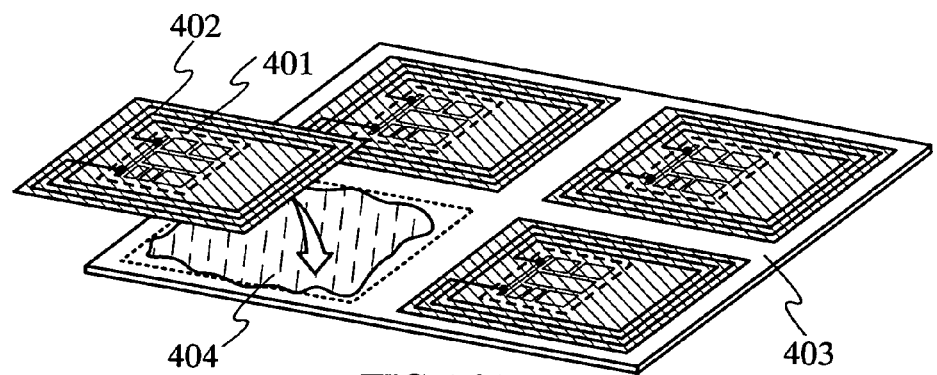
FIGS. 16A to 16D show a method for manufacturing a plurality of semiconductor devices according to certain aspects of the present invention, using a large-sized substrate.

First, an integrated circuit 401 and an antenna 402 is formed over a heat-resistant substrate, and then they are attached to a substrate 403 separately provided by using an adhesive 404 as shown in FIG. 16A. Note that FIG. 16A shows a state in which the integrated circuit 401 and the antenna 402 are attached to the substrate 403 per pair; however, the present invention is not limited to this structure. A pair of the integrated circuit 401 and the antenna 402 may be partially connected to peel so that they are attached to the substrate 403 at a time.

Figure 16B:
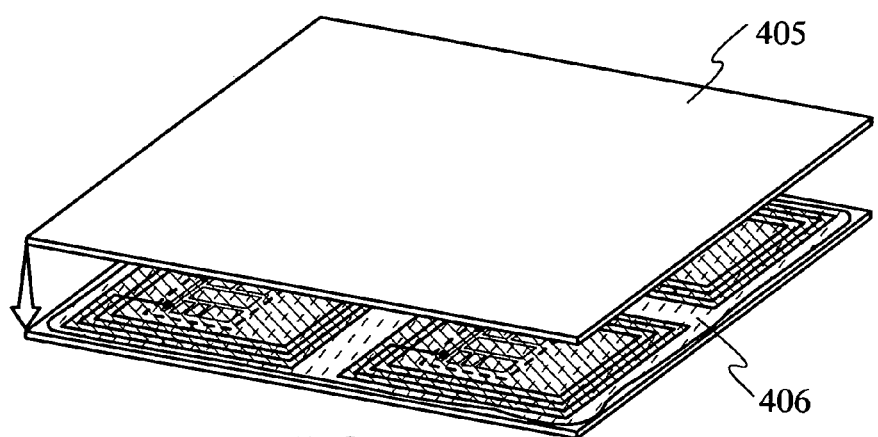
Figure 16C:
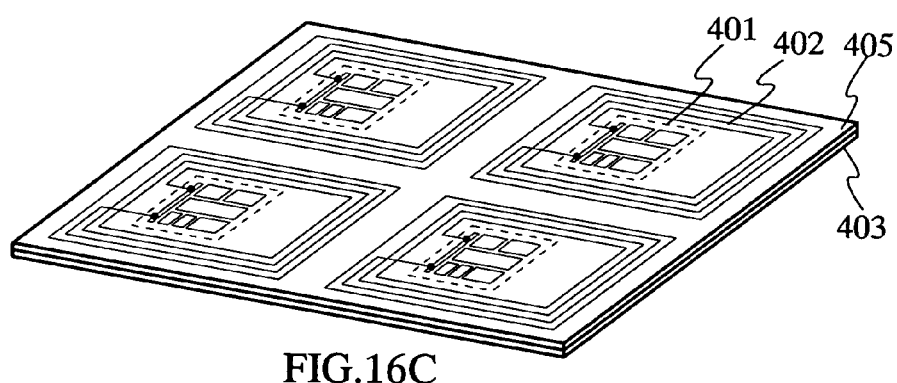

As shown in FIG. 16B, a cover member 405 is attached to the substrate 403 to sandwich the integrated circuit 401 and the antenna 402 therebetween. At this time, an adhesive 406 is coated over the substrate 403 to cover the integrated circuit 401 and the antenna 402. A state shown in FIG. 16C can be obtained by attaching the cover member 405 to the substrate 403. Note that FIG. 16C shows the integrated circuit 401 and the antenna 402 so that they are to be seen transparently through the cover member 405.

Figure 16D:
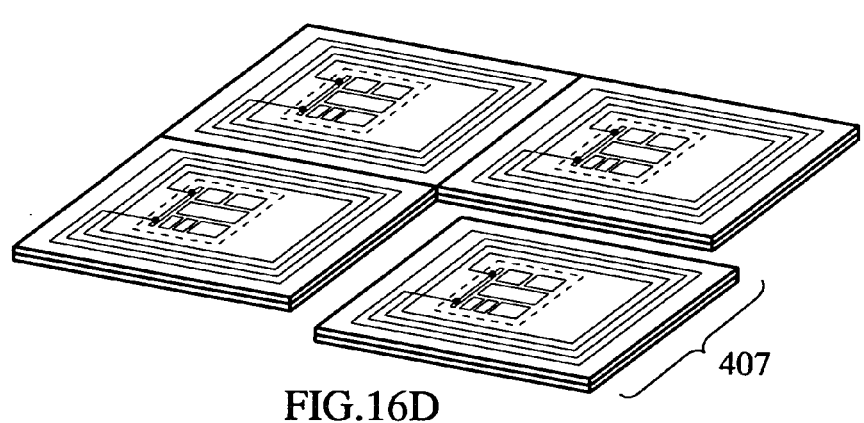

As shown in FIG. 16D, an ID chip 407 is completed by separating the integrated circuit 401 and the antenna 402 with each other by dicing or scribing.

Note that this embodiment shows an example of peeling the antenna 402 concurrently with the integrated circuit 401; however, this embodiment is not limited to this structure. By forming the antenna 402 over the substrate 403 in advance, the integrated circuit 401 may be electrically connected to the antenna 402 when the integrated circuit 401 is attached to the substrate 403. After attaching the integrated circuit 401 to the substrate 403, the antenna 402 may be attached to connect electrically to the integrated circuit 401. Alternatively, the integrated circuit 401 may be electrically connected to the antenna 402 when the cover member 405 is attached to the substrate 403 by forming the antenna 402 over the cover member 405 in advance.

Note that an ID chip using a glass substrate can be referred to as an IDG chip (Identification Glass Chip) and an ID chip using a flexible substrate can be referred to as an IDF chip (Identification Flexible Chip).

This embodiment can be combined appropriately with Embodiments 1 to 6.

[Embodiment 8]

Figure 17A:
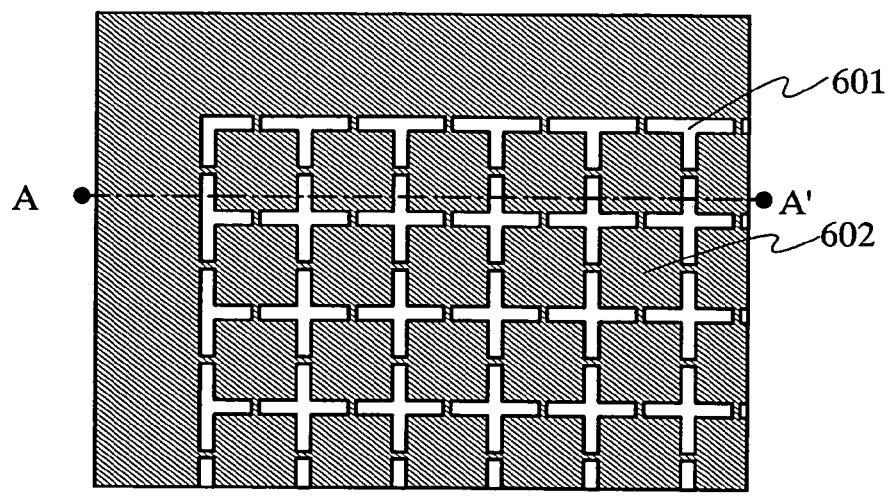
FIGS. 17A to 17D show shapes of a groove to be formed when a plurality of semiconductor devices formed over one substrate is peeled.

This embodiment describes a groove shape to be formed when a plurality of semiconductor devices formed over one substrate is peeled. FIG. 17A shows a top view of a substrate 603 in which a groove 601 is formed. In addition, FIG. 17B shows a cross-sectional view taken along a line A–A' in FIG. 17A.

A semiconductor device 602 is formed over a peeling layer 604, the peeling layer 604 is formed over a buffer film 606, and the buffer film 606 is formed over a substrate 603. The groove 601 is formed between each of the semiconductor devices 602 and a deepness of the groove has enough to expose the peeling layer 604. In this embodiment, the plurality of the semiconductor devices 602 is not completely but partially separated by the groove 601.

Figure 17B:
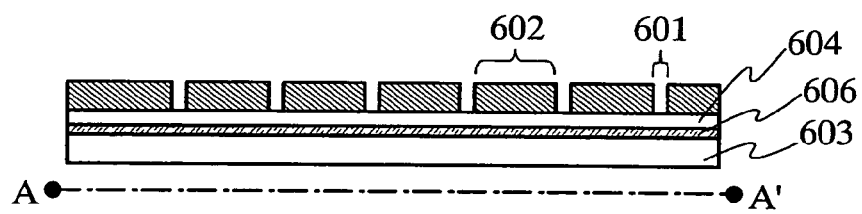
Figure 17C:
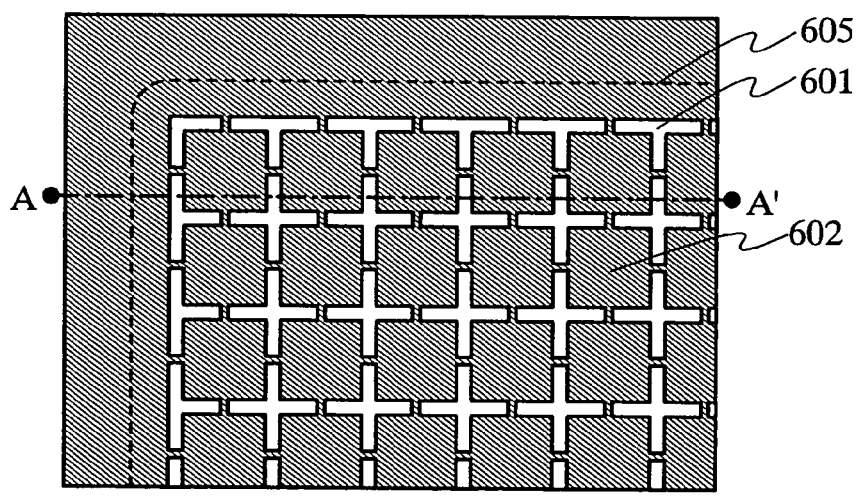
Figure 17D:
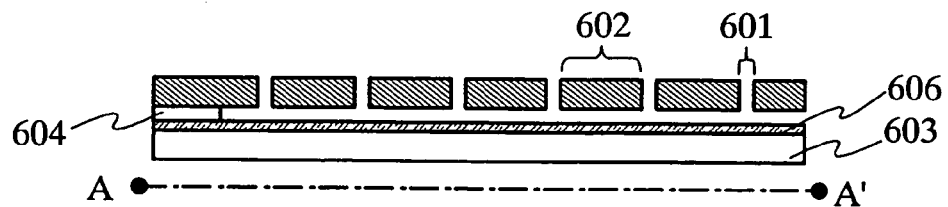

FIGS. 17C and 17D show the state of the substrate and the semiconductor device after flowing etching gas into the groove 601 shown in FIGS. 17A and 17B to remove the peeling layer 604 by etching. FIG. 17C corresponds to a top view of the substrate 603 where the groove 601 is formed, and FIG. 17D corresponds to a cross-sectional view taken along a line A–A' in FIG. 17C. It is assumed that a peeling layer 604 is etched from the groove 601 to a region 605 shown in a broken line. As shown in FIGS. 17C and 17D, the plurality of semiconductor devices 602 is not completely separated by the groove 601 but is partially connected so that each of the semiconductor devices 602 does not move due to the lack of a support after etching the peeling layer 604.

When etching of the peeling layer 604 is performed up to the states shown in FIGS. 17C and 17D, a tape coated with an adhesive, a substrate, and the like are separately prepared, and the semiconductor devices 602 are peeled from the substrate 603. Then, the plurality of peeled semiconductor devices 602 are attached to the substrate separately prepared before or after separating the semiconductor devices 602 with each other.

Note that this embodiment shows an example of a method for manufacturing an ID chip; however, a method for manufacturing the ID chip by employing a manufacturing method of the present invention is not limited to the structure shown in this embodiment.

This embodiment can be combined appropriately with Embodiments 1 to 7.

[Embodiment 9]

The following can be given as an example of semiconductor devices manufactured by employing a manufacturing method of the present invention which can be used: electronic devices including a camera such as a video camera or a digital camera, a goggle type display (head mounted display), a navigation system, an audio reproducing device (a car audio, an audio component, and the like), a computer, a game machine, a portable information terminal (a mobile computer, a cellular phone, a portable game machine, an electronic book, and the like), an image reproduction device provided with a recording medium (specifically a device that is capable of playing a recording medium such as a Digital Versatile Disc (DVD) and that has a display device that can display the image), and the like. When a flexible substrate realizes weight reduction and thinning easily compared with a glass substrate and a peeled semiconductor element is attached to the flexible substrate, a semiconductor device realizes reduction in weight and size, and thinning easily. Thus, a semiconductor device formed by employing the manufacturing method of the invention is appropriate particularly for a portable electronic device or a display device having a comparatively large-sized screen. FIGS. 18A to 18E show a specific example of the electronic devices.

Figure 18A:
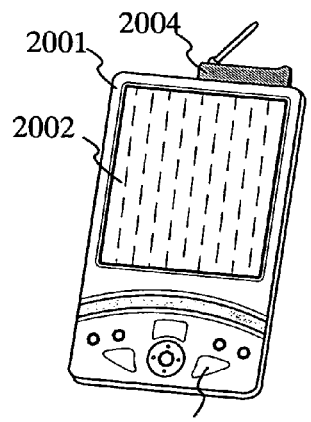
FIGS. 18A to 18E are views of an electronic device employing a semiconductor device.

FIG. 18A is a portable information terminal, which includes a main body 2001, a display portion 2002, operation keys 2003, a modem 2004, and the like. FIG. 18A shows the portable information terminal with the modem 2004 having a removable mode; however, the modem may be built in the main body 2001. According to the invention, the portable information terminal can be completed by manufacturing the display portion 2002 or other signal processing circuits. In addition, according to the invention, a yield of the portable information terminal can be enhanced, and as a result, a price per portable information terminal with good quality can lowered.

Figure 18B:
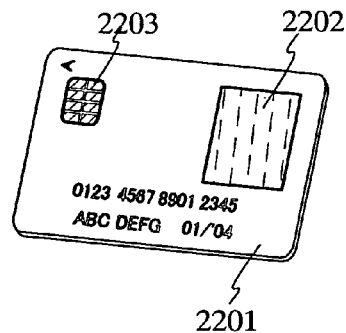

FIG. 18B is an IC card, which includes a main body 2201, a display portion 2202, a connection terminal 2203, and the like. According to the invention, the IC card can be completed by manufacturing the display portion 2202 or other signal processing circuits. In addition, according to the invention, a yield of the IC card can be enhanced, and as a result, a price per IC card with good quality can be lowered. Note that FIG. 18B shows a contact electronic card; however, the semiconductor device of the invention can be employed for a non-contact IC card or an IC card having the both operation of a contact card and a non-contact card.

Figure 18C:
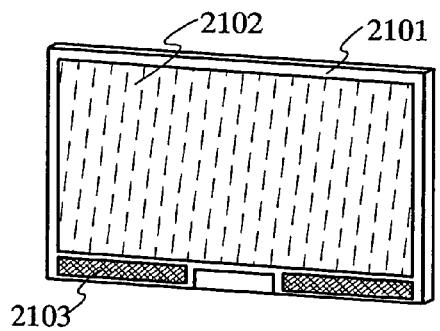

FIG. 18C is a display device, which includes a casing 2101, a display portion 2102, a speaker portion 2103, and the like. According to the invention, the display device can be completed by manufacturing the display portion 2102 or other signal processing circuits. In addition, according to the invention, a yield of the display device can be enhanced, and as a result, a price per display device with good quality can be lowered. Note that the display device includes all information display devices for a computer, television broadcast reception, advertisement display, and the like.

Figure 18D:
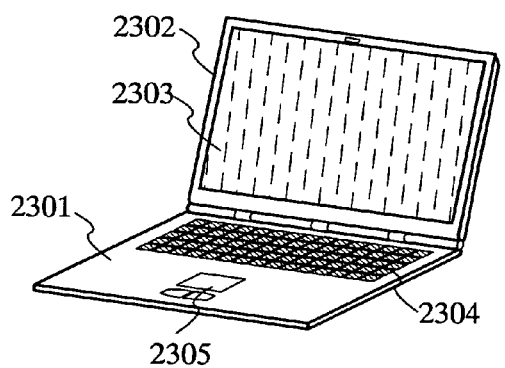

FIG. 18D is a computer, which includes a main body 2301, a casing 2302, a display portion 2303, a keyboard 2304, a mouse 2305, and the like. Note that the computer may be one in which a monitor and a main body having CPU are incorporated (for example, a laptop computer) or may be one in which a monitor and a main body having CPU are separated (for example, a desktop computer). According to the invention, the computer can be completed by manufacturing the display portion 2303 or other signal processing circuits. In addition, according to the invention, a yield of the computer can be enhanced, and as a result, a price per computer with good quality can be lowered.

Figure 18E:
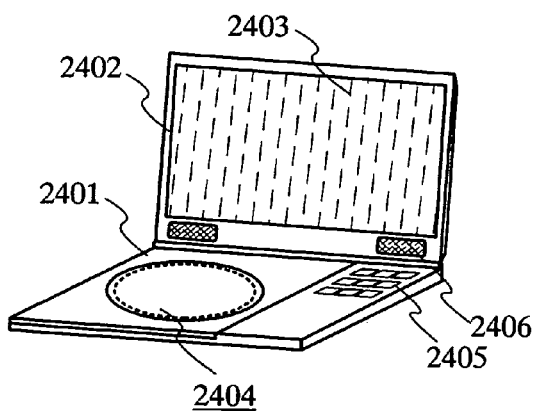

FIG. 18E is an image reproduction device provided with a recording medium (specifically a Digital Versatile Disc (DVD) reproducing device), which includes a main body 2401, a casing 2402, a display portion 2403, a recording medium (a DVD and the like) reading portion 2404, operation keys 2405, a speaker portion 2406, and the like. The image reproduction device provided with a recording medium includes a home-use game machine or the like. According to the invention, the image reproduction device can be completed by manufacturing the display portion 2403 or other signal processing circuits. In addition, according to the invention, a yield of the image reproduction device can be enhanced, and as a result, a price per image reproduction device with good quality can be lowered.

As mentioned above, the application range of the invention is extremely wide, and the invention can be employed for electronic devices in various fields. In addition, the electronic devices in this embodiment may apply any structure shown in Embodiments 1 to 8.

The present application is based on Japanese Patent Application serial No. 2004-088613 filed on Mar. 25, 2004 with the Japanese Patent Office, the entire contents of which are hereby incorporated by reference.

What is claimed is:

1. A method for manufacturing a semiconductor display device comprising:
   forming a buffer film in contact with a substrate;
   forming a peeling layer in contact with the buffer film;

forming a base film over the peeling layer;
forming a semiconductor film over the base film;
crystallizing the semiconductor film;
forming a semiconductor element by using the crystallized semiconductor film; and
peeling the base film and the semiconductor element from the substrate and the buffer film by removing the peeling layer by etching,
wherein the semiconductor film is crystallized by using a continuous-wave laser or a pulsed laser with repetition rate of 10 MHz or more.

2. The method for manufacturing a semiconductor device according to claim 1, wherein the peeling layer contains silicon.

3. The method for manufacturing a semiconductor device according to claim 1, wherein gas or liquid containing halide can be used as the etchant for the etching.

4. The method for manufacturing a semiconductor device according to claim 1, wherein silicon oxide or silicon oxynitride is used for the buffer film.

5. The method for manufacturing a semiconductor device according to claim 1, wherein silicon oxide, silicon oxynitride, silicon nitride, or silicon nitride oxide is used for the base film.

6. A method for manufacturing a semiconductor display device comprising:
forming a buffer film in contact with a substrate;
forming a peeling layer in contact with the buffer film;
forming a base film over the peeling layer;
forming a semiconductor film over the base film;
crystallizing the semiconductor film by using a continuous-wave laser or a pulsed laser with repetition rate of 10 MHz or more;
forming a semiconductor element by using the crystallized semiconductor film; and
peeling the base film and the semiconductor element from the substrate and the buffer film by removing the peeling layer by etching,
wherein the peeling layer is crystallized concurrently in crystallizing the semiconductor film.

7. The method for manufacturing a semiconductor device according to claim 6, wherein the peeling layer contains silicon.

8. The method for manufacturing a semiconductor device according to claim 6, wherein gas or liquid containing halide can be used as the etchant for the etching.

9. The method for manufacturing a semiconductor device according to claim 6, wherein silicon oxide or silicon oxynitride is used for the buffer film.

10. The method for manufacturing a semiconductor device according to claim 6, wherein silicon oxide, silicon oxynitride, silicon nitride, or silicon nitride oxide is used for the base film.

11. The method for manufacturing a semiconductor device according to claim 6,
wherein the base film is formed by laminating three or more insulating films,
wherein silicon oxide or silicon oxynitride is used for an insulating film nearest to the buffer film of the three or more insulating films,
wherein silicon oxide or silicon oxynitride is used for an insulating film nearest to the peeling layer of the three or more insulating films, and
wherein silicon nitride or silicon nitride oxide is used for an insulating film formed between the insulating film nearest to the buffer film and the insulating film nearest to the peeling layer of the three or more insulating films.

12. A method for manufacturing a semiconductor display device comprising:
forming a buffer film in contact with a first substrate;
forming a peeling layer in contact with the buffer film;
forming a base film over the peeling layer;
forming a semiconductor film over the base film;
crystallizing the semiconductor film by using a continuous-wave laser or a pulsed laser with repetition rate of 10 MHz or more;
forming a semiconductor element by using the crystallized semiconductor film;
peeling the base film and the semiconductor element from the first substrate and the buffer film by removing the peeling layer by etching, and
attaching the peeled base film and the peeled semiconductor film to a second substrate,
wherein the peeling layer is crystallized concurrently in crystallizing the semiconductor film.

13. The method for manufacturing a semiconductor device according to claim 7, wherein the second substrate has flexibility.

14. The method for manufacturing a semiconductor device according to claim 7, wherein the peeling layer contains silicon.

15. The method for manufacturing a semiconductor device according to claim 7, wherein gas or liquid containing halide can be used as the etchant for the etching.

16. The method for manufacturing a semiconductor device according to claim 7, wherein silicon oxide or silicon oxynitride is used for the buffer film.

17. The method for manufacturing a semiconductor device according to claim 7, wherein silicon oxide, silicon oxynitride, silicon nitride, or silicon nitride oxide is used for the base film.

18. The method for manufacturing a semiconductor device according to claim 12,
wherein the base film is formed by laminating three or more insulating films,
wherein silicon oxide or silicon oxynitride is used for an insulating film nearest to the buffer film of the three or more insulating films,
wherein silicon oxide or silicon oxynitride is used for an insulating film nearest to the peeling layer of the three or more insulating films, and
wherein silicon nitride or silicon nitride oxide is used for an insulating film formed between the insulating film nearest to the buffer film and the insulating film nearest to the peeling layer of the three or more insulating films.

19. A method for manufacturing a semiconductor display device comprising:
forming a buffer film in contact with the substrate;
forming a peeling layer in contact with the buffer film;
forming a base film over the peeling layer;
forming a semiconductor film over the base film;
crystallizing the semiconductor film by using a continuous-wave laser or a pulsed laser with repetition rate of 10 MHz or more;
forming a plurality of a semiconductor elements by using the crystallized semiconductor film;
forming such a groove that the peeling layer is exposed between the plurality of semiconductor elements; and peeling the base film and the plurality of semiconductor elements from the substrate and the buffer film by flowing etching gas from the groove to remove the peeling layer by etching, wherein the peeling layer is crystallized concurrently in crystallizing the semiconductor film.

20. The method for manufacturing a semiconductor device according to claim 14, wherein the peeling layer contains silicon.

21. The method for manufacturing a semiconductor device according to claim 14, wherein gas or liquid containing halide can be used as the etchant.

22. The method for manufacturing a semiconductor device according to claim 14, wherein silicon oxide or silicon oxynitride is used for the buffer film.

23. The method for manufacturing a semiconductor device according to claim 14, wherein silicon oxide, silicon oxynitride, silicon nitride, or silicon nitride oxide is used for the base film.

24. The method for manufacturing a semiconductor device according to claim 14, wherein the base film is formed by laminating three or more insulating films, wherein silicon oxide or silicon oxynitride is used for an insulating film nearest to the buffer film of the three or more insulating films, wherein silicon oxide or silicon oxynitride is used for an insulating film nearest to the peeling layer of the three or more insulating films, and wherein silicon nitride or silicon nitride oxide is used for an insulating film formed between the insulating film nearest to the buffer film and the insulating film nearest to the peeling layer of the three or more insulating films.

25. A method for manufacturing a semiconductor display device comprising:

forming a buffer film in contact with a first substrate;
forming a peeling layer in contact with the buffer film;
forming a base film over the peeling layer;
forming a semiconductor film over the base film;
crystallizing the semiconductor film by using a continuous-wave laser or a pulsed laser with repetition rate of 10 MHz or more;
forming a plurality of a semiconductor elements by using the crystallized semiconductor film;
forming such a groove that the peeling layer is exposed between the plurality of semiconductor elements;
peeling the base film and the plurality of semiconductor elements from the first substrate and the buffer film by flowing etching gas from the groove to remove the peeling layer by etching; and
attaching the peeled based film and plurality of semiconductor elements to a second substrate, wherein the peeling layer is crystallized concurrently in crystallizing the semiconductor film.

26. The method for manufacturing a semiconductor device according to claim 25, wherein the second substrate has flexibility.

27. The method for manufacturing a semiconductor device according to claim 25, wherein the peeling layer contains silicon.

28. The method for manufacturing a semiconductor device according to claim 25, wherein gas or liquid containing halide can be used as the etchant.

29. The method for manufacturing a semiconductor device according to claim 25, wherein silicon oxide or silicon oxynitride is used for the buffer film.

30. The method for manufacturing a semiconductor device according to claim 15, wherein silicon oxide, silicon oxynitride, silicon nitride, or silicon nitride oxide is used for the base film.

31. The method for manufacturing a semiconductor device according to claim 25, wherein the base film is formed by laminating three or more insulating films, wherein silicon oxide or silicon oxynitride is used for an insulating film nearest to the buffer film of the three or more insulating films, wherein silicon oxide or silicon oxynitride is used for an insulating film nearest to the peeling layer of the three or more insulating films, and wherein silicon nitride or silicon nitride oxide is used for an insulating film formed between the insulating film nearest to the buffer film and the insulating film nearest to the peeling layer of the three or more insulating films.

* * * * *